(12) United States Patent
Inazu et al.

(10) Patent No.: US 12,166,152 B2
(45) Date of Patent: Dec. 10, 2024

(54) SEMICONDUCTOR LIGHT-EMITTING DEVICE AND METHOD OF MANUFACTURING SEMICONDUCTOR LIGHT-EMITTING DEVICE

(71) Applicant: NIKKISO CO., LTD., Tokyo (JP)

(72) Inventors: Tetsuhiko Inazu, Hakusan (JP); Noritaka Niwa, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 842 days.

(21) Appl. No.: 17/354,632

(22) Filed: Jun. 22, 2021

(65) Prior Publication Data

US 2022/0013690 A1    Jan. 13, 2022

(30) Foreign Application Priority Data

Jul. 7, 2020    (JP) .................................. 2020-116985

(51) Int. Cl.
*H01L 33/24*    (2010.01)
*H01L 33/00*    (2010.01)
(Continued)

(52) U.S. Cl.
CPC .......... *H01L 33/24* (2013.01); *H01L 33/0075* (2013.01); *H01L 33/32* (2013.01);
(Continued)

(58) Field of Classification Search
CPC ..... H01L 33/24; H01L 33/0075; H01L 33/32; H01L 33/38; H01L 33/44; H01L 33/62; H01L 2933/0016; H01L 2933/0066
See application file for complete search history.

(56) References Cited

U.S. PATENT DOCUMENTS 10,490,537 B2 * 11/2019 Bae .................... H01L 25/0753
2020/0020741 A1 *  1/2020 Woo ....................... H01L 33/24

FOREIGN PATENT DOCUMENTS

JP    2006351575 A    12/2006
JP    2019106406 A     6/2019
(Continued)

OTHER PUBLICATIONS

Office Action (with English translation) corresponding Japanese Patent Application No. 2020-116985 dated Sep. 1, 2020 (pp. 4).

(Continued)

*Primary Examiner* — Changhyun Yi
(74) *Attorney, Agent, or Firm* — Muncy, Geissler, Olds & Lowe, P.C.

(57) ABSTRACT

A device includes: an active layer provided in a first comb tooth region on an n-type semiconductor layer; a p-type semiconductor layer provided on the active layer; an n-side contact electrode provided in a second comb tooth region on the n-type semiconductor layer; a p-side contact electrode provided in a third comb tooth region on the p-type semiconductor layer; a protective layer having a p-side pad opening provided in a fourth comb tooth region on the p-side contact electrode, having an n-side pad opening provided in a fifth comb tooth region on the n-side contact electrode, and made of a dielectric material; a p-side pad electrode connected to the p-side contact electrode in the p-side pad opening; and an n-side pad electrode connected to the n-side contact electrode in the n-side pad opening.

7 Claims, 14 Drawing Sheets

(51) Int. Cl.
 *H01L 33/32* (2010.01)
 *H01L 33/38* (2010.01)
 *H01L 33/44* (2010.01)
 *H01L 33/62* (2010.01)

(52) U.S. Cl.
 CPC .............. *H01L 33/38* (2013.01); *H01L 33/44* (2013.01); *H01L 33/62* (2013.01); *H01L 2933/0016* (2013.01); *H01L 2933/0066* (2013.01)

(56) References Cited

FOREIGN PATENT DOCUMENTS

| | | |
|---|---|---|
| JP | 2020064955 A | 4/2020 |
| TW | I518876 B | 1/2016 |
| WO | WO-2017014094 A1 | 1/2017 |

OTHER PUBLICATIONS

Office Action (with English translation) corresponding Japanese Patent Application No. 2020-116985 dated Nov. 24, 2020 (pp. 4).

\* cited by examiner

SEMICONDUCTOR LIGHT-EMITTING DEVICE AND METHOD OF MANUFACTURING SEMICONDUCTOR LIGHT-EMITTING DEVICE

RELATED APPLICATION

Priority is claimed to Japanese Patent Application No. 2020-116985, filed on Jul. 7, 2020, the entire content of which is incorporated herein by reference.

BACKGROUND OF THE INVENTION

1. Field of the Invention

The present invention relates to a semiconductor light-emitting device and a method of manufacturing a semiconductor light-emitting device.

2. Description of the Related Art

A semiconductor light-emitting element includes an n-type semiconductor layer, an active layer, and a p-type semiconductor layer stacked on a substrate. A p-side electrode is provided on the p-type semiconductor layer, and an n-side electrode is provided on the n-type semiconductor layer. A structure in which the p-side electrode and the n-side electrode are in a comb tooth shape is proposed in order to suppress unevenness in luminescence (see, for example, WO2017/014094).

In the case the electrodes are formed in a comb tooth shape, it is difficult to secure a relatively large rectangular or circular area on the electrodes for bonding or for flip-chip bonding. As a result, the step of bonding a semiconductor light-emitting element to a packaging substrate, etc. will be difficult.

SUMMARY OF THE INVENTION

The present invention addresses the above-described issue, and an illustrative purpose thereof is to improve distribution of light emission from a semiconductor light-emitting element and, at the same time, simplify the packaging step.

A semiconductor light-emitting device according to an embodiment of the present invention includes: an n-type semiconductor layer made of an n-type AlGaN-based semiconductor material; an active layer provided in a first comb tooth region on the n-type semiconductor layer and made of an AlGaN-based semiconductor material; a p-type semiconductor layer provided on the active layer; an n-side contact electrode provided in a second comb tooth region on the n-type semiconductor layer inserted in the first comb tooth region; a p-side contact electrode provided in a third comb tooth region on the p-type semiconductor layer; a protective layer having a p-side pad opening provided in a fourth comb tooth region on the p-side contact electrode and an n-side pad opening provided in a fifth comb tooth region on the n-side contact electrode, the protective layer covering the p-side contact electrode in a portion different from the p-side pad opening, covering the n-side contact electrode in a portion different from the n-side pad opening, and being made of a dielectric material; a p-side pad electrode provided on the protective layer and connected to the p-side contact electrode in the p-side pad opening, and an n-side pad electrode provided on the protective layer and connected to the n-side contact electrode in the n-side pad opening.

According to this embodiment, the light emission distribution of the semiconductor light-emitting element can be improved by configuring the active layer, the n-side contact electrode, and the p-side contact electrode to have a comb tooth shape. The step of packaging the light-emitting element can be simplified by forming the n-side pad electrode on the n-side contact electrode and forming the p-side pad electrode on the p-side contact electrode. Further, by configuring the n-side pad opening and the p-side pad opening to have a comb tooth shape, the intra-plane uniformity of the current flowing in the n-side contact electrode and the p-side contact electrode having the comb tooth shape can be enhanced. This can further improve the light emission distribution of the light-emitting element.

The n-side contact electrode may include: a plurality of n-side finger electrodes provided at intervals in a first direction and extending in a second direction intersecting the first direction; and an n-side bus bar electrode connecting ends of the plurality of n-side finger electrodes and extending in the first direction along an outer edge of the n-type semiconductor layer. Each of the active layer and the p-type semiconductor layer may include an inner finger part inserted between the plurality of n-side finger electrodes and extending in the second direction, an outer finger part extending in the second direction along the outer edge of the n-type semiconductor layer, and a bus bar part connecting ends of the inner finger part and the outer finger part and extending in the first direction along the outer edge of the n-type semiconductor layer. The p-side contact electrode may include a p-side inner finger electrode provided on the inner finger part, a p-side outer finger electrode provided on the outer finger part, and a p-side bus bar electrode provided on the bus bar part and connecting ends of the p-side inner finger electrode and the p-side outer finger electrode.

A width of the outer finger part in the first direction may be smaller than a width of the inner finger part in the first direction. A width of the p-side outer finger electrode in the first direction may be smaller than a width of the p-side inner finger electrode in the first direction.

The n-side contact electrode may include an n-side contact layer in contact with the n-type semiconductor layer, a first current diffusion layer provided on the n-side contact layer, and a second current diffusion layer provided on the first current diffusion layer. The p-side contact electrode may include a p-side contact layer in contact with the p-type semiconductor layer and a p-side current diffusion layer provided on the n-side contact layer. A difference between a height of an upper surface of the p-side contact layer and a height of an upper surface of the first current diffusion layer may be 100 nm or smaller, and a difference between a height of an upper surface of the p-side current diffusion layer and a height of an upper surface of the second current diffusion layer may be 100 nm or smaller.

The semiconductor light-emitting device may further include: a p-side bump provided at a position on the p-side pad electrode that overlaps the third comb tooth region; an n-side bump provided at a position on the n-side pad electrode that overlaps the third comb tooth region; and a packaging substrate bonded to the p-side bump and the n-side bump.

Another embodiment of the present invention relates to a method of manufacturing a semiconductor light-emitting device. The method includes: forming an active layer made of an AlGaN-based semiconductor material on an n-type semiconductor layer made of an n-type AlGaN-based semiconductor material; forming a p-type semiconductor layer on the active layer; removing the p-type semiconductor layer and the active layer in a region different from a first comb tooth region on the n-type semiconductor layer to expose an upper surface of the n-type semiconductor layer; forming an n-side contact electrode in a second comb tooth region on the n-type semiconductor layer inserted in the first comb tooth region; forming a p-side contact electrode in a third comb tooth region on the p-type semiconductor layer; forming a protective layer covering the p-side contact electrode and the n-side contact electrode and made of a dielectric material; forming a p-side pad opening in a fourth comb tooth region on the p-side contact electrode, the p-side pad opening extending through the protective layer; forming an n-side pad opening in a fifth comb tooth region on the n-side contact electrode, the n-side pad opening extending through the protective layer; forming a p-side pad electrode provided on the protective layer and connected to the p-side contact electrode in the p-side pad opening; and forming an n-side pad electrode provided on the protective layer and connected to the n-side contact electrode in the n-side pad opening.

According to this embodiment, the light emission distribution of the semiconductor light-emitting element can be improved by configuring the active layer, the n-side contact electrode, and the p-side contact electrode to have a comb tooth shape. The step of packaging the light-emitting element can be simplified by forming the n-side pad electrode on the n-side contact electrode and forming the p-side pad electrode on the p-side contact electrode. Further, by configuring the n-side pad opening and the p-side pad opening to have a comb tooth shape, the intra-plane uniformity of the current flowing in the n-side contact electrode and the p-side contact electrode having the comb tooth shape can be enhanced. This can further improve the light emission distribution of the light-emitting element.

The method may further include: forming a p-side bump and an n-side bump on a packaging substrate; and bonding the p-side bump at a position on the p-side pad electrode that overlaps the third comb tooth region and bonding the n-side bump at a position on the n-side pad electrode that overlaps the third comb tooth region.

DETAILED DESCRIPTION OF THE INVENTION

Figure 1:
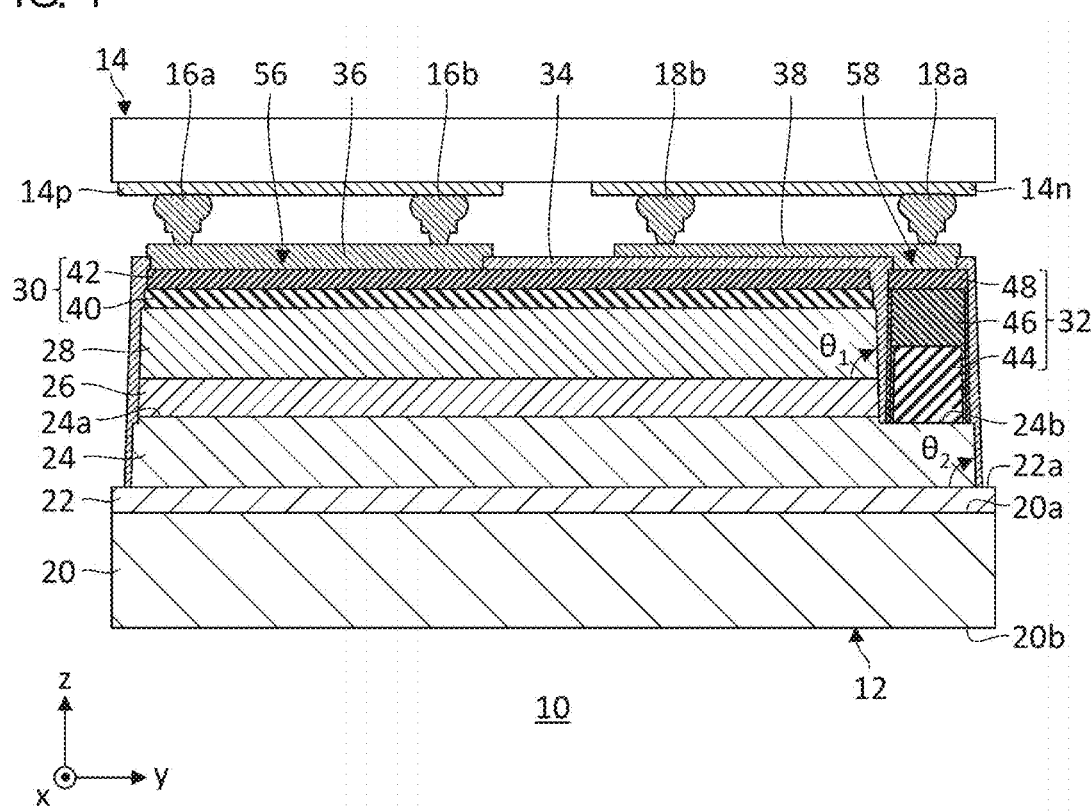
FIG. 1 is a cross-sectional view schematically showing a configuration of a semiconductor light-emitting device according to the first embodiment.

The invention will now be described by reference to the preferred embodiments. This does not intend to limit the scope of the present invention, but to exemplify the invention.

A description will be given of embodiments of the present invention with reference to the drawings. The same numerals are used in the description to denote the same elements, and a duplicate description is omitted as appropriate. To facilitate the understanding, the relative dimensions of the constituting elements in the drawings do not necessarily mirror the relative dimensions in the light-emitting element.

The semiconductor light-emitting device according to the embodiments is a so-called deep ultraviolet-light emitting diode (DUV-LED) chip configured to emit "deep ultraviolet light" having a central wavelength λ of about 360 nm or shorter. To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength λ of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" include GaN or InGaN. Similarly, those materials that do not contain GaN may be distinguished by referring to them as "AlN-based semiconductor materials". "AlN-based semiconductor materials" include AlN or InAlN.

First Embodiment

FIG. 1 is a cross-sectional view schematically showing a configuration of a semiconductor light-emitting device 10 according to the first embodiment. The semiconductor light-emitting device 10 includes a semiconductor light-emitting element 12, a packaging substrate 14, a p-side outer bump 16a and a p-side inner bump 16b (generically referred to as p-side bumps 16), and an n-side outer bump 18a and an n-side inner bump 18b (generically referred to as n-side bumps 18). The semiconductor light-emitting element 12 is bonded to or packaged on the packaging substrate 14 via the p-side bumps 16 and the n-side bumps 18.

The semiconductor light-emitting element 12 includes a substrate 20, a base layer 22, an n-type semiconductor layer 24, an active layer 26, a p-type semiconductor layer 28, a p-side contact electrode 30, an n-side contact electrode 32, a protective layer 34, a p-side pad electrode 36, and an n-side pad electrode 38. The p-side contact electrode 30 includes a p-side contact layer 40 and a p-side current diffusion layer 42. The n-side contact electrode 32 includes an n-side contact layer 44, a first current diffusion layer 46, and a second current diffusion layer 48.

Referring to FIG. 1, the direction from the semiconductor light-emitting element 12 toward the packaging substrate 14 is defined as the z direction, the direction from the p-side pad electrode 36 toward the n-side pad electrode 38 is defined as the y direction, and the direction orthogonal to the y direction and the z direction is defined as "x direction". In this embodiment, the z direction may be referred to as "vertical direction" or "direction of thickness". In a view of the substrate 20, the direction away from the substrate 20 may be referred to as upward, and the direction toward the substrate 20 may be referred to as downward.

In this embodiment, the terms "first direction" and "second direction" may be used as directions orthogonal to the direction of thickness. For example, the first direction is the x direction, and the second direction is the y direction. In this embodiment, a description will be given of a case where the first direction and the second direction are orthogonal to each other. Alternatively, the first direction and the second direction need not be orthogonal to each other, and the second direction may diagonally intersect the first direction.

The substrate 20 includes a first principal surface 20a and a second principal surface 20b opposite to the first principal surface 20a. The first principal surface 20a is a crystal growth surface for growing the layers from the base layer 22 to the p-type semiconductor layer 28. The substrate 20 is made of a material having translucency for the deep ultraviolet light emitted by the semiconductor light-emitting device 10 and is made of, for example, sapphire ($Al_2O_3$). A fine concave-convex pattern (not shown) having a submicron (1 µm or less) depth and pitch is formed on the first principal surface 20a. The substrate 20 like this is also called a patterned sapphire substrate (PSS). The second principal surface 20b is a light extraction substrate for extracting the deep ultraviolet light emitted by the active layer 26 outside. The substrate 20 may be made of AlN or made of AlGaN. The first principal surface 20a of the substrate 20 may be configured as a flat surface that is not patterned.

The base layer 22 is provided on the first principal surface 20a of the substrate 20. The base layer 22 is a foundation layer (template layer) to form the n-type semiconductor layer 24. For example, the base layer 22 is made of an undoped AlN and is, specifically, made of AlN grown at a high temperature (HT-AlN; High Temperature AlN). The base layer 22 may include an AlN layer and an undoped AlGaN layer formed on the AlN layer. The base layer 22 may be comprised only of an undoped AlGaN layer when the substrate 20 is an AlN substrate or an AlGaN substrate. The base layer 22 includes at least one of an undoped AlN layer and an undoped AlGaN layer. An upper surface 22a of the base layer 22 is exposed on the outer circumference of the semiconductor light-emitting element 12.

The n-type semiconductor layer 24 is provided on the base layer 22. The n-type semiconductor layer 24 is made of an n-type AlGaN-based semiconductor material layer. For example, the n-type semiconductor layer 24 may be doped with silicon (Si) as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is 25% or higher, and, preferably, 40% or higher or 50% or higher. The n-type semiconductor layer 24 has a band gap larger than the wavelength of the deep ultraviolet light emitted by the active layer 26. For example, the n-type semiconductor layer 24 is formed to have a band gap of 4.3 eV or larger. It is preferred to form the n-type semiconductor layer 24 such that the molar fraction of AlN is 80% or lower, i.e., the band gap is 5.5 eV or smaller. It is more desired to form the n-type semiconductor layer 24 such that the molar fraction of AlN is 70% or lower (i.e., the band gap is 5.2 eV or smaller). The n-type semiconductor layer 24 has a thickness of about 1 µm-3 µm. For example, the n-type semiconductor layer 24 has a thickness of about 2 µm.

The n-type semiconductor layer 24 is formed such that the concentration of Si as the impurity is equal to or more than $1 \times 10^{18}/cm^3$ and equal to or less than $5 \times 10^{19}/cm^3$. It is preferred to form the n-type semiconductor layer 24 such that the Si concentration is equal to or more than $5 \times 10^{18}/cm^3$ and equal to or less than $3 \times 10^{19}/cm^3$ and, more preferably, equal to or more than $7 \times 10^{18}/cm^3$ and equal to or less than $2 \times 10^{19}/cm^3$. In one example, the Si concentration in the n-type semiconductor layer 24 is around $1 \times 10^{19}/cm^3$ and is, more specifically, in a range equal to or more than $8 \times 10^{18}/cm^3$ and equal to or less than $1.5 \times 10^{19}/cm^3$.

The n-type semiconductor layer 24 includes a first upper surface 24a and a second upper surface 24b. The first upper surface 24a is where the active layer 26 is formed. The second upper surface 24b is where the active layer 26 is not formed, and the n-side contact electrode 32 is formed. The first upper surface 24a and the second upper surface 24b differ in height, and the height from the substrate 20 to the first upper surface 24a is larger than the height from the substrate 20 to the second upper surface 24b.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 320 nm or shorter.

The active layer 26 has, for example, a monolayer or multilayer quantum well structure. The active layer 26 is comprised of a stack of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the well layer and the barrier layer may be additionally provided between the first barrier layer and the first well layer. Each of the barrier layer and the well layer has a thickness of about 1 nm-20 nm, and has a thickness of, for example, about 2 nm-10 nm.

The active layer 26 may further include an electron blocking layer directly in contact with the p-type semiconductor layer 28. The electron blocking layer is made of an undoped AlGaN-based semiconductor material and is formed such that the molar fraction of AlN is 40% or higher, and, preferably, 50% or higher. The electron blocking layer may be formed such that the molar fraction of AlN is 80% or higher or may be made of an AlN-based semiconductor material that does not contain GaN. The electron blocking layer has a thickness of about 1 nm-10 nm. For example, the electron blocking layer has a thickness of about 2 nm-5 nm.

The p-type semiconductor layer 28 is formed on the active layer 26. The p-type semiconductor layer 28 is made of a p-type AlGaN-based semiconductor material or a p-type GaN-based semiconductor material. For example, the p-type semiconductor layer 28 is made of AlGaN or GaN doped with magnesium (Mg) as a p-type impurity. The p-type semiconductor layer 28 has a thickness of about 300 nm-1400 nm. For example, the height from the second upper surface 24b of the n-type semiconductor layer 24 to the upper surface 28a of the p-type semiconductor layer 28 is configured to be equal to or more than 400 nm and equal to or less than 1500 nm.

The p-type semiconductor layer 28 may be comprised of a plurality of layers. The p-type semiconductor layer 28 may include, for example, a p-type clad layer and a p-type contact layer. The p-type clad layer is a p-type AlGaN layer having a higher AlN ratio as compared with the p-type contact layer and is provided to be directly in contact with the active layer 26. The p-type contact layer is a p-type AlGaN layer or a p-type GaN layer having a lower AlN ratio as compared with the p-type clad layer. The p-type contact layer is provided on the p-type clad layer and is provided to be directly in contact with the p-side contact electrode 30.

The composition ratio of the p-type clad layer is selected to transmit the deep ultraviolet light emitted by the active layer 26. The p-type clad layer is formed such that the molar fraction of AlN is 25% or higher and, preferably, 40% or higher, or 50% or higher. The AlN ratio of the p-type clad layer is, for example, similar to the AlN ratio of the n-type semiconductor layer 24 or larger than the AlN ratio of the n-type semiconductor layer 24. The AlN ratio of the p-type clad layer may be 70% or higher, or 80% or higher. The p-type clad layer has a thickness of about 10 nm-100 nm and has a thickness of, for example, about 15 nm-70 nm.

The p-type contact layer is formed such that the AlN ratio is 20% or lower in order to obtain proper ohmic contact with the p-side contact electrode 30. Preferably, the p-type contact layer is formed such that the AlN ratio is 10% or lower, 5% or lower, or 0%. In other words, the p-type contact layer may be made of a p-type GaN-based semiconductor material that does not contain AlN. The p-type contact layer has a thickness of about 300 nm-1500 nm. For example, the p-type contact layer has a thickness of about 500 nm-1000 nm.

The p-side contact electrode 30 is provided on the p-type semiconductor layer 28. The p-side contact electrode 30 includes the p-side contact layer 40 in contact with the upper surface of the p-type semiconductor layer 28 and a p-side current diffusion layer 42 in contact with the upper surface of the p-side contact layer 40.

The p-side contact layer 40 is made of a material that can be in ohmic contact with the p-type semiconductor layer 28. For example, the p-side contact layer 40 is made of a transparent conductive oxide (TCO) such as tin oxide ($SnO_2$), zinc oxide (ZnO), and indium tin oxide (ITO). The thickness of the p-side contact layer 40 is about 20 nm-500 nm and is preferably 50 nm or larger and is, more preferably, 100 nm or larger.

The p-side current diffusion layer 42 is connected to the p-side pad electrode 36 in a p-side pad opening 56. It is preferred that the p-side current diffusion layer 42 has a certain thickness in order to diffuse the current injected from the p-side pad electrode 36 in the lateral direction (horizontal direction). The thickness of the p-side current diffusion layer 42 is equal to or more than 300 nm and equal to or less than 1500 nm and is, for example, about 500 nm-1000 nm.

The p-side current diffusion layer 42 has a stack structure in which a first TiN layer, a metal layer, and a second TiN layer are sequentially stacked. The first TiN layer is in contact with the p-side contact layer 40. The second TiN layer is in contact with the p-side pad electrode 36. The metal layer is provided between the first TiN layer and the second TiN layer. The first TiN layer and the second TiN layer are made of titanium nitride (TiN) having conductivity. The conductivity of TiN having conductivity is $1\times10^{-5}$ Ω·m or lower, and is, for example, about $4\times10^{-7}$ Ω·m. The thickness of each of the first TiN layer and the second TiN layer is 10 nm or larger and is, for example, about 50 nm-200 nm.

The metal layer of the p-side current diffusion layer 42 is comprised of a single metal film or a plurality of metal films. The metal layer of the p-side current diffusion layer 42 is made of a metal material such as titanium (Ti), chromium (Cr), nickel (Ni), aluminum (Al), platinum (Pt), palladium (Pd), or rhodium (Rh). The metal layer of the p-side current diffusion layer 42 may have a structure in which a plurality of metal layers made of different materials are stacked. The metal layer of the p-side current diffusion layer 42 may have a structure in which a first metal film made of a first metal material and a second metal film made of a second metal material are stacked. Alternatively, the metal layer may have a structure in which a plurality of first metal films and a plurality of second metal films are alternately stacked. The metal layer of the p-side current diffusion layer 42 may further include a third metal film made of a third metal material. The thickness of the metal layer of the p-side current diffusion layer 42 is larger than the thickness of each of the first TiN layer and the second TiN layer. The thickness of the metal layer of the p-side current diffusion layer 42 is 100 nm or larger, and is, for example, about 300 nm-800 nm.

The n-side contact electrode 32 includes the n-side contact layer 44 in contact with the second upper surface 24b of the n-type semiconductor layer 24, the first current diffusion layer 46 that covers the upper surface and the side surface of the n-side contact layer 44, and the second current diffusion layer 48 that covers the upper surface and the side surface of the first current diffusion layer 46.

The n-side contact layer 44 has a stack structure comprised of a metal layer and a TiN layer. The metal layer of the n-side contact layer 44 is made of a material that can be in ohmic contact with the n-type semiconductor layer 24 and has a high reflectivity for the deep ultraviolet light emitted by the active layer 26. The metal layer of the n-side contact layer 44 includes, for example, a Ti layer directly in contact with the n-type semiconductor layer 24 and an aluminum (Al) layer directly in contact with the Ti layer. The thickness of the Ti layer is about 1 nm-10 nm and is, preferably, 5 nm or smaller and, more preferably, 1 nm-2 nm. By configuring the Ti layer to have a small thickness, the ultraviolet reflectivity of the n-side contact layer 44 as viewed from the n-type semiconductor layer 24 can be enhanced. The thickness of the Al layer is preferably 200 nm or larger and is, for example, about 300 nm-1000 nm. By configuring the Al layer to have a large thickness, the ultraviolet reflectivity of the n-side contact layer 44 can be enhanced. The metal layer of the n-side contact layer 44 may further include a Ti layer provided on the Al layer.

The TiN layer of the n-side contact layer 44 is provided on the metal layer of the n-side contact layer 44 and is made of TiN having conductivity. The conductivity of TiN having conductivity is $1\times10^{-5}$ Ω·m or lower, and is, for example, about $4\times10^{-7}$ Ω·m. The thickness of TiN layer of the n-side contact layer 44 is 10 nm or larger and is, for example, about 50 nm-200 nm.

The first current diffusion layer 46 is provided on the n-side contact layer 44. The first current diffusion layer 46 covers the entirety of the upper surface and the side surface of the n-side contact layer 44 and prevents the upper surface or the side surface of the n-side contact layer 44 from being exposed. The thickness of the first current diffusion layer 46 is equal to or more than 100 nm and equal to or less than 1000 nm and is, for example, about 200 nm-800 nm.

The first current diffusion layer 46 has a stack structure in which a first TiN layer, a metal layer, and a second TiN layer are stacked sequentially. The first current diffusion layer 46 may have a stack structure similar to that of the p-side current diffusion layer 42. The thickness of each of the first TiN layer and the second TiN layer of the first current diffusion layer 46 is 10 nm or larger and is, for example, about 50 nm-200 nm. The thickness of the first current diffusion layer 46 is 100 nm or larger and is, for example, about 200 nm-800 nm.

The first current diffusion layer 46 is formed to be aligned in height with the p-side contact layer 40. In other words, the height of the upper surface of the first current diffusion layer 46 substantially matches the height of the upper surface of the p-side contact layer 40. More specifically, the difference between the height of the upper surface of the first current diffusion layer 46 and the height of the upper surface of the p-side contact layer 40 is configured to be 100 nm or smaller and, preferably, 50 nm or smaller. The height of the upper surface of the first current diffusion layer 46 may be larger than, smaller than, or perfectly match the height of the upper surface of the p-side contact layer 40.

The second current diffusion layer 48 is provided on the first current diffusion layer 46. The second current diffusion layer 48 covers the entirety of the upper surface and the side surface of the first current diffusion layer 46 and prevents the upper surface or the side surface of the first current diffusion layer 46 from being exposed. The thickness of the second current diffusion layer 48 is equal to or more than 300 nm and equal to or less than 1500 nm and is, for example, about 500 nm-1000 nm.

The second current diffusion layer 48 has a stack structure in which a first TiN layer, a metal layer, and a second TiN layer are stacked sequentially. The second current diffusion layer 48 may be configured in a manner similar to that of the p-side current diffusion layer 42. The thickness of the second current diffusion layer 48 and the thickness of the p-side current diffusion layer 42 are configured to be equal. As a result, the height of the upper surface of the second current diffusion layer 48 substantially matches the height of the upper surface of the p-side current diffusion layer 42. More specifically, the difference between the height of the upper surface of the second current diffusion layer 48 and the height of the upper surface of the p-side current diffusion layer 42 is configured to be 100 nm or smaller and, preferably, 50 nm or smaller. The height of the upper surface of the second current diffusion layer 48 may be larger than, smaller than, or perfectly match the height of the upper surface of the p-side current diffusion layer 42.

The protective layer 34 is provided to cover the entirety of the stack structure between the base layer 22 and the p-side pad electrode 36 and between the base layer 22 and the n-side pad electrode 38. The protective layer 34 is made of a dielectric material such as silicon oxide ($SiO_2$), silicon oxynitride (SiON), silicon nitride (SiN), aluminum nitride (AlN), and aluminum oxynitride (AlON). The thickness of the protective layer 34 is 100 nm or larger and is, for example, about 500 nm-2000 nm.

The protective layer 34 is provided to cover the side surface (mesa surface) of the n-type semiconductor layer 24, the active layer 26, and the p-type semiconductor layer 28. The protective layer 34 covers the p-side contact electrode 30 in a portion on the p-side contact electrode 30 different from the p-side pad opening 56. The protective layer 34 covers the n-side contact electrode 32 in a portion on the n-side contact electrode 32 different from the n-side pad opening 58.

The side surface (referred to as a first mesa surface) of the n-type semiconductor layer 24, the active layer 26, and the p-type semiconductor layer 28 is configured to be sloped with respect to the second principal surface 20b of the substrate 20. A first angle $\theta_1$ of slope of the side surface (the first mesa surface) of the active layer 26 and the p-type semiconductor layer 28 is equal to or more than 15° and equal to or less than 50° and is, for example, equal to or more than 20° and equal to or less than 40°. Denoting the refractive index of the active layer 26 by n, it is preferred that the first angle $\theta_1$ is $\theta_1 < \{\pi/2 + \sin^{-1}(1/n)\}/2$. Setting the first angle $\theta_1$ to such a value prevents the ultraviolet light from being totally reflected by the second principal surface 20b of the substrate 20 and failing to output outside the substrate 20. A second angle $\theta_2$ of slope of the side surface (referred to as a second mesa surface) of the n-type semiconductor layer 24 is equal to or more than 55° and less than 70° (excluding 70°), and is, for example, about 60°-65°. The second angle $\theta_2$ is larger than the first angle $\theta_1$.

The p-side pad electrode 36 is provided on the protective layer 34 and is electrically connected to the p-side contact electrode 30 in the p-side pad opening 56. The p-side pad electrode 36 is provided to be in contact with the upper surface of the p-side current diffusion layer 42 in the p-side pad opening 56 and to block the p-side pad opening 56. The n-side pad electrode 38 is provided on the protective layer 34 and is electrically connected to the n-side contact electrode 32 in the n-side pad opening 58. The n-side pad electrode 38 is provided to be in contact with the upper surface of the second current diffusion layer 48 in the n-side pad opening 58 and to block the n-side pad opening 58. From the perspective of providing resistance to corrosion, the p-side pad electrode 36 and the n-side pad electrode 38 are configured to contain Au. For example, the p-side pad electrode 36 and the n-side pad electrode 38 are comprised of a Ni/Au, Ti/Au, or Ti/Pt/Au stack structure.

The p-side bump 16 is provided between the p-side pad electrode 36 and a p-side packaging electrode 14p. The n-side bump 18 is provided between the n-side pad electrode 38 and an n-side packaging electrode 14n. The p-side bump 16 is bonded to the p-side pad electrode 36 and the p-side packaging electrode 14p and electrically connects the p-side pad electrode 36 and the p-side packaging electrode 14p. The n-side bump 18 is bonded to the n-side pad electrode 38 and the n-side packaging electrode 14n and electrically connects the n-side pad electrode 38 and the n-side packaging electrode 14n. The p-side bump 16 is, for example, an Au stud bump and is bonded to the Au layer of the p-side pad electrode 36 and the Au layer of the p-side packaging electrode 14p. Similarly, n-side bump 18 is, for example, an Au stud bump and is bonded to the Au layer of the n-side pad electrode 38 and the Au layer of the n-side packaging electrode 14n.

Figure 2:
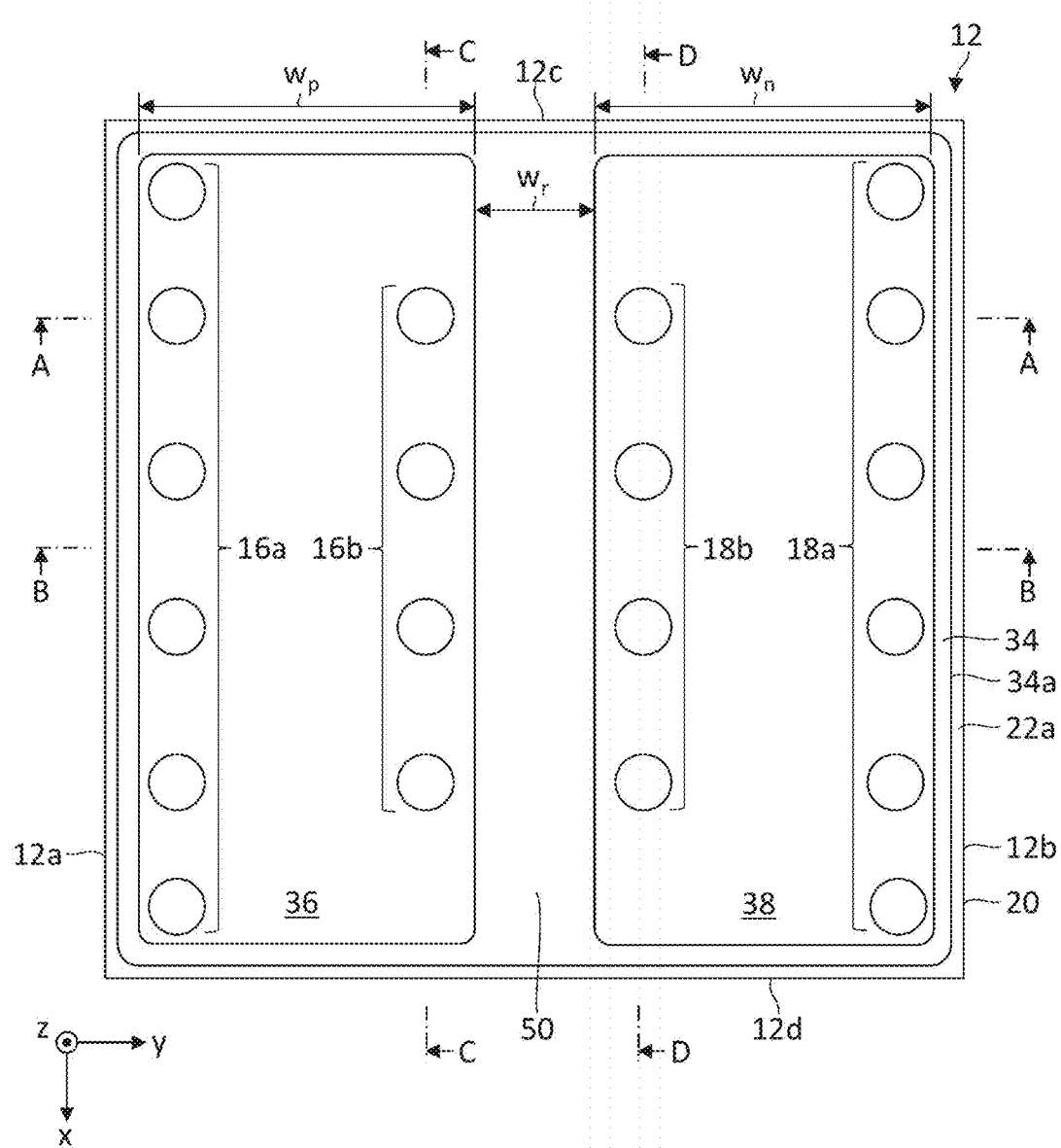
FIG. 2 is a top view schematically showing a configuration of a semiconductor light-emitting element.

FIG. 2 is a top view schematically showing a configuration of a semiconductor light-emitting element 12. FIG. 1 corresponds to an A-A cross section of FIG. 2. In a plan view of FIG. 2, the outer shape of the semiconductor light-emitting element 12 is a rectangle or a square. The outer circumference of the semiconductor light-emitting element 12 is defined by four side surfaces 12a-12d. The first side surface 12a and the second side surface 12b extend in the first direction (x direction). The third side surface 12c and the fourth side surface 12d extend in the second direction (y direction).

The protective layer 34 is provided to be slightly spaced apart from the outer circumference of the semiconductor light-emitting element 12. An outer circumferential region, in which the protective layer 34 is not provided and the upper surface 22a of the base layer 22 is exposed, is provided between the outer circumference of the semiconductor light-emitting element 12 and an outer edge 34a of the protective layer 34. The outer edge 34a of the protective layer 34 is formed to have a rectangular shape corresponding to the outer circumference of the semiconductor light-emitting element 12 and, preferably, a shape of a rectangle or a square chamfered at the four corners by curves.

The p-side pad electrode 36 is provided to occupy about half the area on the left side (toward the first side surface 12a) of the protective layer 34. The n-side pad electrode 38 is provided to occupy about half the area on the right side (toward the second side surface 12b) of the protective layer 34. The outer edge 34a of the p-side pad electrode 36 and the n-side pad electrode 38 is formed to have a rectangular shape and, preferably, a shape of a rectangle chamfered at the four corners by curves. A separation part 50 in which the protective layer 34 is exposed is provided between the p-side pad electrode 36 and the n-side pad electrode 38.

The width $w_p$ of the p-side pad electrode 36 in the second direction (y direction) is equal to or larger than the width $w_n$ of the n-side pad electrode 38 in the second direction (y direction). The width $w_n$ of the n-side pad electrode 38 in the second direction (y direction) is larger than the width $w_r$ of the separation part 50 in the x direction. In short, $w_p \geq w_n > w_r$. The width $w_p$ of the p-side pad electrode 36 is 300 μm or larger and is, for example, 500 μm or larger. The width $w_n$ of the n-side pad electrode 38 is 200 μm or larger and is, for example, 300 μm or larger. The width $w_r$ of the separation part 50 is 100 μm or larger and is, for example, about 150 μm-300 μm. The length in the first direction (x direction) is common to the p-side pad electrode 36 and the n-side pad electrode 38.

The plurality of p-side outer bumps 16a and the plurality of p-side inner bumps 16b are provided on the p-side pad electrode 36. The plurality of p-side outer bumps 16a are arranged at intervals in the first direction (x direction) along the first side surface 12a. The plurality of p-side inner bumps 16b are arranged at intervals in the first direction (x direction) along the separation part 50. Similarly, the plurality of n-side outer bumps 18a and the plurality of n-side inner bumps 18b are provided on the n-side pad electrode 38. The plurality of n-side outer bumps 18a are arranged at intervals in the first direction (x direction) along the second side surface 12b. The plurality of n-side inner bumps 18b are arranged at intervals in the first direction (x direction) along the separation part 50. The diameter of the p-side bump 16 and the n-side bump 18 is, for example, about 80 μm.

Figure 3:
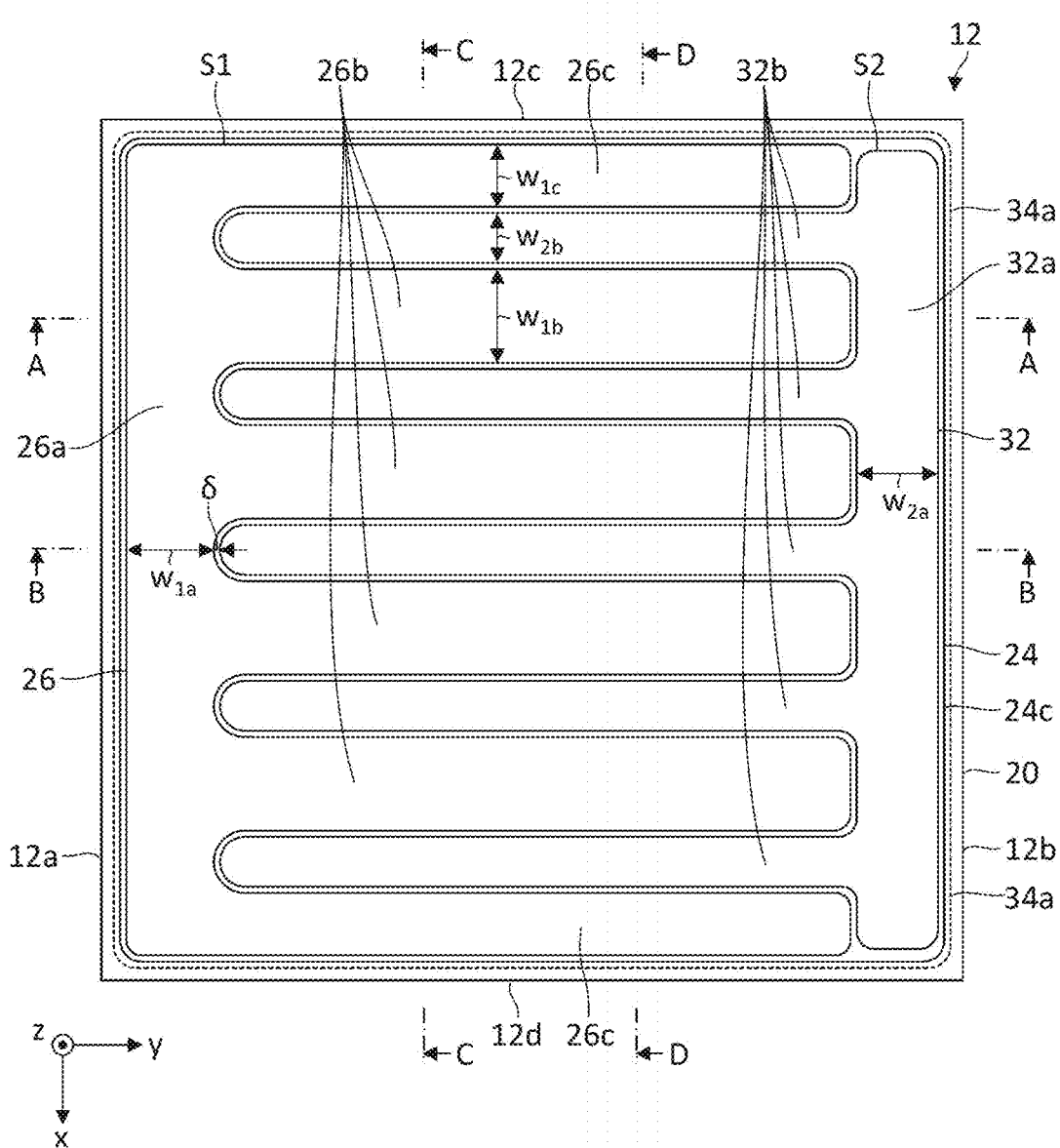
FIG. 3 is a top view schematically showing an arrangement of the n-type semiconductor layer, the active layer, and the n-side contact electrode.

FIG. 3 is a top view schematically showing an arrangement of the n-type semiconductor layer 24, the active layer 26, and the n-side contact electrode 32. FIG. 3 shows the position of the outer edge 34a of the protective layer 34 by a broken line. The n-type semiconductor layer 24 is provided inside the outer edge 34a of the protective layer 34. An outer edge 24c of the n-type semiconductor layer 24 is formed to have a rectangular shape corresponding to the outer edge 34a of the protective layer 34 and, preferably, a shape of a rectangle or a square shape chamfered at the four corners by curves.

The active layer 26 is provided in a first comb tooth region S1 on the n-type semiconductor layer 24. The active layer 26 is formed to have a comb tooth shape. In this embodiment, the comb tooth shape is defined as a shape including branches corresponding to a plurality of teeth and a stem connecting the plurality of teeth and, in particular, as a one-side comb tooth shape provided with a plurality of teeth only on one side. In this embodiment, the plurality of branches of the comb tooth shape are also referred to as "fingers", and the stem of the comb tooth shape is also referred to as a "bus bar".

The active layer 26 includes a bus bar part 26a extending in the first direction (x direction), inner finger parts 26b extending in the second direction (y direction), and outer finger parts 26c extending in the second direction (y direction). The bus bar part 26a is provided along the first side surface 12a and connects the ends of the inner finger parts 26b and the outer finger parts 26c. The outer finger part 26c is provided along the third side surface 12c or the fourth side surface 12d. The active layer 26 is provided along three side surfaces including the first side surface 12a, the third side surface 12c, and the fourth side surface 12d.

In the illustrated example, four inner finger parts 26b and two outer finger parts 26c are provided. The four inner finger parts 26b and the two outer finger parts 26c are arranged at intervals in the first direction (x direction). The n-side contact electrode 32 (32b) is inserted between two adjacent inner finger parts 26b. Similarly, the n-side contact electrode 32 (32b) is inserted between the inner finger part 26b and the outer finger part 26c. It is preferred that the outer circumference of the active layer 26 has a shape chamfered by curves.

The width $w_{1a}$ of the bus bar part 26a of the active layer 26 in the second direction (y direction) is equal to or larger than the width $w_{1b}$ of the inner finger part 26b in the first direction (x direction). The width $w_{1b}$ of the inner finger part 26b of the active layer 26 in the first direction (x direction) is larger than the width $w_{1o}$ of the outer finger part 26c in the first direction (x direction). In short, $w_{1a} \geq w_{1b} \geq w_{1c}$. The width $w_{1a}$ of the bus bar part 26a of the active layer 26 and the width $w_{1b}$ of the inner finger part 26b are preferably larger than the diameter of the p-side bump 16 and the n-side bump 18 and are, for example, about 80 μm-120 μm. The width $w_{1o}$ of the outer finger part 26c of the active layer 26 is, for example, about 40 μm-80 μm.

The p-type semiconductor layer 28 (not shown in FIG. 3) is provided to overlap the entirety of the active layer 26 and has a comb tooth shape similar to that of the active layer 26. The p-type semiconductor layer 28 includes a bus bar part extending in the first direction (x direction), inner finger parts extending in the second direction (y direction), and outer finger parts extending in the second direction (y direction). The bus bar part of the p-type semiconductor layer 28 overlaps the bus bar part 26a of the active layer 26. The inner finger parts of the p-type semiconductor layer 28 overlap the inner finger parts 26b of the active layer 26. The outer finger parts of the p-type semiconductor layer 28 overlap the outer finger parts 26c of the active layer 26.

The n-side contact electrode 32 is provided in a second comb tooth region S2 on the n-type semiconductor layer 24 that inserted in the first comb tooth region S1. A gap δ is provided between the first comb tooth region S1 and the second comb tooth region S2. The second comb tooth region S2 is provided to be adjacent to the first comb tooth region S1 in the first direction (x direction) and in the second direction (y direction).

The n-side contact electrode 32 is formed to have a comb tooth shape and includes an n-side bus bar electrode 32a extending in the first direction (x direction) and a plurality of n-side finger electrodes 32b extending in the second direction (y direction). The n-side bus bar electrode 32a is provided along the second side surface 12b and connects the ends of the plurality of n-side finger electrodes 32b. The plurality of n-side finger electrodes 32b are provided between two adjacent inner finger parts 26b or between the inner finger part 26b and the outer finger part 26c. The n-side finger electrode 32b is not provided along the outer circumference of the semiconductor light-emitting element 12. It is preferred that the outer circumference of the n-side contact electrode 32 has a shape chamfered by curves.

The width $w_{2a}$ of the n-side bus bar electrode 32a in the second direction (y direction) is larger than the width $w_{2b}$ of the n-side finger electrode 32b in the first direction (x direction). In short, $w_{2a} > w_{2b}$. The width $w_{2a}$ of the n-side bus bar electrode 32a in the second direction (y direction) is preferably larger than the diameter of the p-side bump 16 and the n-side bump 18 and is, for example, about 80 μm-120 μm. The width $w_{2a}$ of the n-side bus bar electrode 32a is equal to or smaller than the width $w_{1a}$ of the bus bar part 26a of the active layer 26. The width $w_{2b}$ of the n-side finger electrode 32b is smaller than the width $w_{1b}$ of the inner finger part 26b of the active layer 26. In short, $w_{1b} > w_{2b}$. The width $w_{2b}$ of the n-side finger electrode 32b is, for example, about 40 μm-80 μm.

The proportion of the total area of the first comb tooth region S1 and the second comb tooth region S2 is about 70-90% of the area of the first principal surface 20a of the substrate 20. For example, the proportion of the area of the first comb tooth region S1 is about 45-60%, and the proportion of the area of the second comb tooth region S2 is about 20-40%. Therefore, the area of the first comb tooth region S1 is larger than the area of the second comb tooth region S2. The area of the first comb tooth region S1 is about 1.5-3 times the area of the second comb tooth region S2.

The first comb tooth region S1 is provided along three side surfaces including the first side surface 12a, the third side surface 12c, and the fourth side surface 12d, and the second comb tooth region S2 is provided along the second side surface 12b. The length of parts of the first comb tooth region S1 parallel to the outer edge 24c of the n-type semiconductor layer 24 is larger than the length of the parts of the second comb tooth region S2 parallel to the outer edge 24c of the n-type semiconductor layer 24. The length of parts of the first comb tooth region S1 parallel to the outer edge 24c of the n-type semiconductor layer 24 is, for example, about 2-3 times the length of the parts of the second comb tooth region S2 parallel to the outer edge 24c of the n-type semiconductor layer 24.

Figure 4:
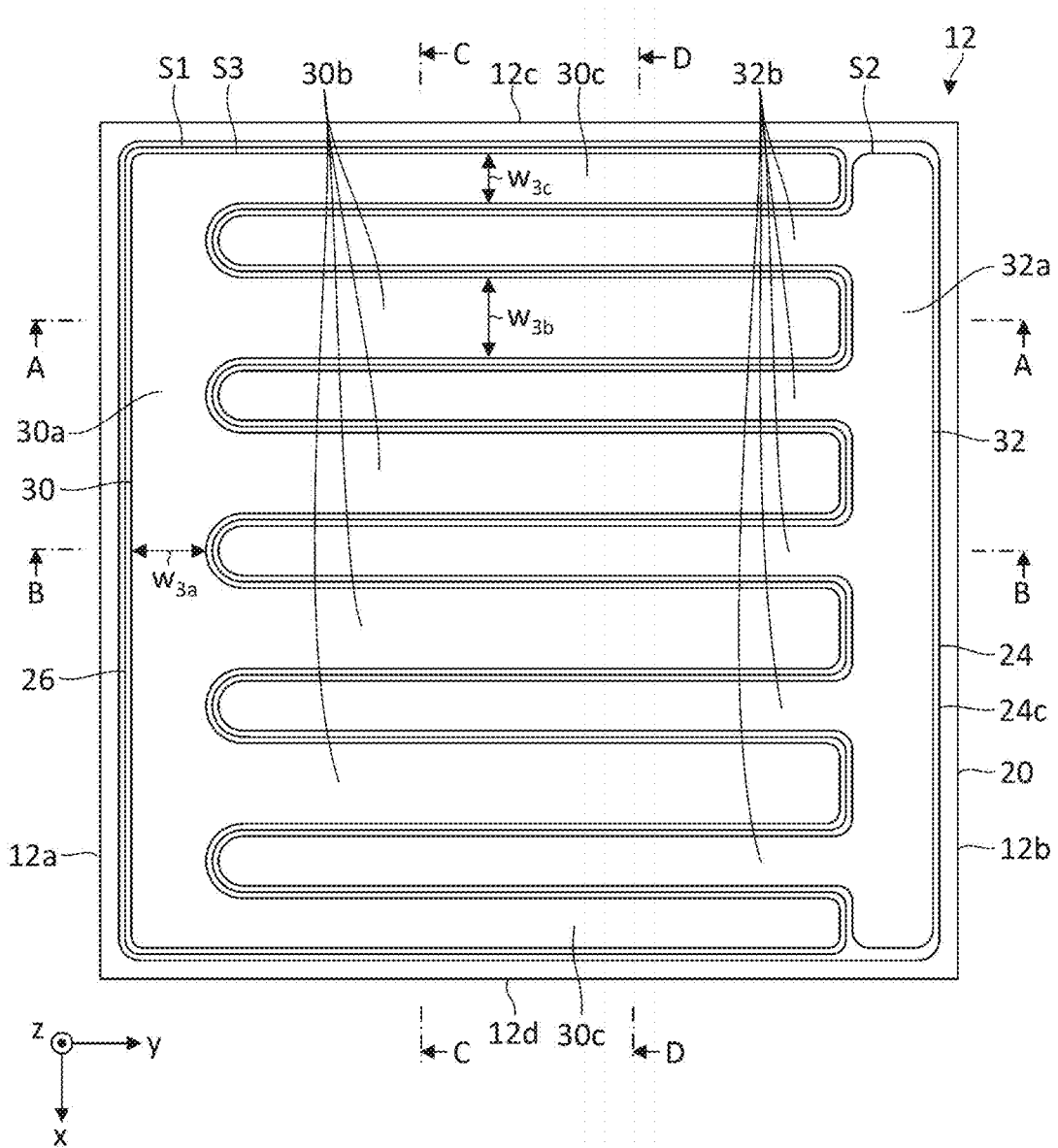
FIG. 4 is a top view schematically showing an arrangement of the p-side contact electrode.

FIG. 4 is a top view schematically showing an arrangement of the p-side contact electrode 30. The p-side contact electrode 30 is provided in a third comb tooth region S3 on the active layer 26 and the p-type semiconductor layer 28. The third comb tooth region S3 has a comb tooth shape corresponding to the first comb tooth region S1 but is narrower than the first comb tooth region S1. The proportion of the area of the third comb tooth region S3 is, for example, about 20-50% of the area of the first principal surface 20a of the substrate 20. The area of the third comb tooth region S3 is larger than the area of the second comb tooth region S2. The third comb tooth region S3 is provided to be inserted in the second comb tooth region S2 and is provided to be adjacent to the second comb tooth region S2 in the first direction (x direction).

Like the active layer 26 and the p-type semiconductor layer 28, the p-side contact electrode 30 is formed to have a comb tooth shape. The p-side contact electrode 30 includes a p-side bus bar electrode 30a extending in the first direction (x direction), p-side inner finger electrodes 30b extending in the second direction (y direction), and p-side outer finger electrodes 30c extending in the second direction (y direction). The p-side bus bar electrode 30a is provided along the first side surface 12a and connects the ends of the p-side inner finger electrodes 30b and the p-side outer finger electrodes 30c. The p-side bus bar electrode 30a overlaps the bus bar parts of the active layer 26 and the p-type semiconductor layer 28. The p-side inner finger electrodes 30b overlap the inner finger parts of the active layer 26 and the p-type semiconductor layer 28. The p-side outer finger electrodes 30c overlap the outer finger parts of the active layer 26 and the p-type semiconductor layer 28. The p-side contact electrode 30 is provided along three side surfaces including the first side surface 12a, the third side surface 12c, and the fourth side surface 12d. It is preferred that the outer circumference of the p-side contact electrode 30 has a shape chamfered by curves.

The width $w_{3a}$ of the p-side bus bar electrode 30a in the second direction (y direction) is equal to or larger than the width $w_{3b}$ of the p-side inner finger electrode 30b in the first direction (x direction). The width $w_{3b}$ of the p-side inner finger electrode 30b in the first direction (x direction) is larger than the width $w_{3c}$ of the p-side outer finger electrode 30c in the first direction (x direction). In short, $w_{3a} \geq w_{3b} > w_{3c}$. The width $w_{3a}$ of the p-side bus bar electrode 30a and the width $w_{3b}$ of the p-side inner finger electrode 30b are preferably equal to or larger than the diameter of the p-side bump 16 and the n-side bump 18 and are, for example, about 80 μm-110 μm. The width $w_{3c}$ of the p-side outer finger electrode 30c is, for example, about 40 μm-70 μm. The widths $w_{3a}$, $w_{3b}$, and $w_{3c}$ of the p-side contact electrode 30 are slightly smaller than the corresponding widths $w_{1a}$, $w_{1b}$, and $w_{1c}$ of the active layer 26 and are, for example, smaller by about 10 μm-30 μm.

Figure 5:
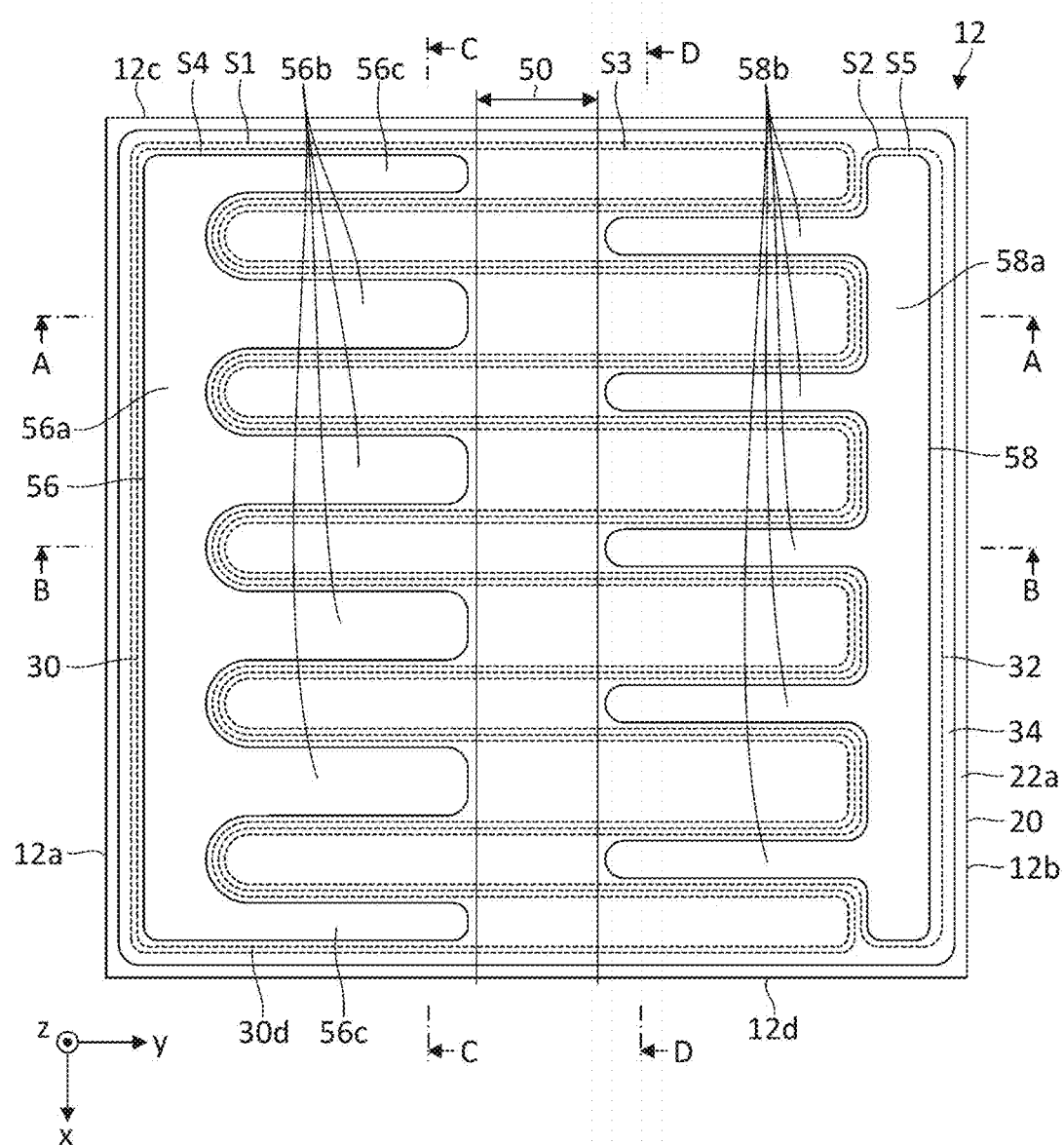
FIG. 5 is a top view schematically showing an arrangement of the p-side pad opening and the n-side pad opening.

FIG. 5 is a top view schematically showing an arrangement of the p-side pad opening 56 and the n-side pad opening 58. FIG. 5 shows the first comb tooth region S1, the second comb tooth region S2, and the third comb tooth region S3 by broken lines. The p-side pad opening 56 is provided in a fourth comb tooth region S4 inside the third comb tooth region S3 and is formed to have a comb shape.

The n-side pad opening 58 is provided in a fifth comb tooth region S5 inside the second comb tooth region S2 and is formed to have a comb shape. The fourth comb tooth region S4 and the fifth comb tooth region S5 are provided so as not to be inserted in each other and are provided so as not to be adjacent in the first direction (x direction). The separation part 50 is provided between the fourth comb tooth region S4 and the fifth comb tooth region S5. The p-side pad opening 56 is provided only to the left (toward the first side surface 12a) of the separation part 50. The n-side pad opening 58 is provided only to the right (toward the second side surface 12b) of the separation part 50.

The p-side pad opening 56 includes a p-side bus bar opening 56a extending in the first direction (x direction), p-side inner finger openings 56b extending in the second direction (y direction), and p-side outer finger openings 56c extending in the second direction (y direction). The p-side bus bar opening 56a is provided along the first side surface 12a and connects the ends of the p-side inner finger openings 56b and the p-side outer finger openings 56c. The p-side outer finger opening 56c is provided along the third side surface 12c or the fourth side surface 12d. The p-side bus bar opening 56a is provided at a position that overlaps the p-side bus bar electrode 30a and exposes the p-side bus bar electrode 30a. The p-side inner finger openings 56b are provided at positions that overlap the p-side inner finger electrodes 30b and expose the p-side inner finger electrodes 30b. The length of the p-side inner finger opening 56b in the second direction (y direction) is smaller than the length of the p-side inner finger electrode 30b in the second direction (y direction) and is, for example, about 10-70% and, preferably, about 20-50%, of the length of the p-side inner finger electrode 30b. The p-side outer finger openings 56c are provided at positions that overlap the p-side outer finger electrodes 30c and expose the p-side outer finger electrodes 30c. The length of the p-side outer finger opening 56c in the second direction (y direction) is smaller than the length of the p-side outer finger electrode 30c in the second direction (y direction) and is, for example, about 10-70% and, preferably, about 20-50%, of the length of the p-side outer finger electrode 30c. It is preferred that the outer circumference of the p-side pad opening 56 has a shape chamfered by curves.

The n-side pad opening 58 includes an n-side bus bar opening 58a extending in the first direction (x direction) and a plurality of n-side finger openings 58b extending in the second direction (y direction). The n-side bus bar opening 58a is provided along the second side surface 12b and connects the ends of the plurality of n-side finger openings 58b. The n-side bus bar opening 58a is provided at a position that overlaps the n-side bus bar electrode 32a and exposes the n-side bus bar electrode 32a. The n-side finger openings 58b are provided at positions that overlap the n-side finger electrodes 32b and expose the n-side finger electrodes 32b. The length of the n-side finger opening 58b in the second direction (y direction) is smaller than the length of the n-side finger electrode 32b in the second direction (y direction) and is, for example, about 10-70% and, preferably, about 20-50%, of the length of the n-side finger electrode 32b. It is preferred that the outer circumference of the n-side pad opening 58 has a shape chamfered by curves.

Figure 6:
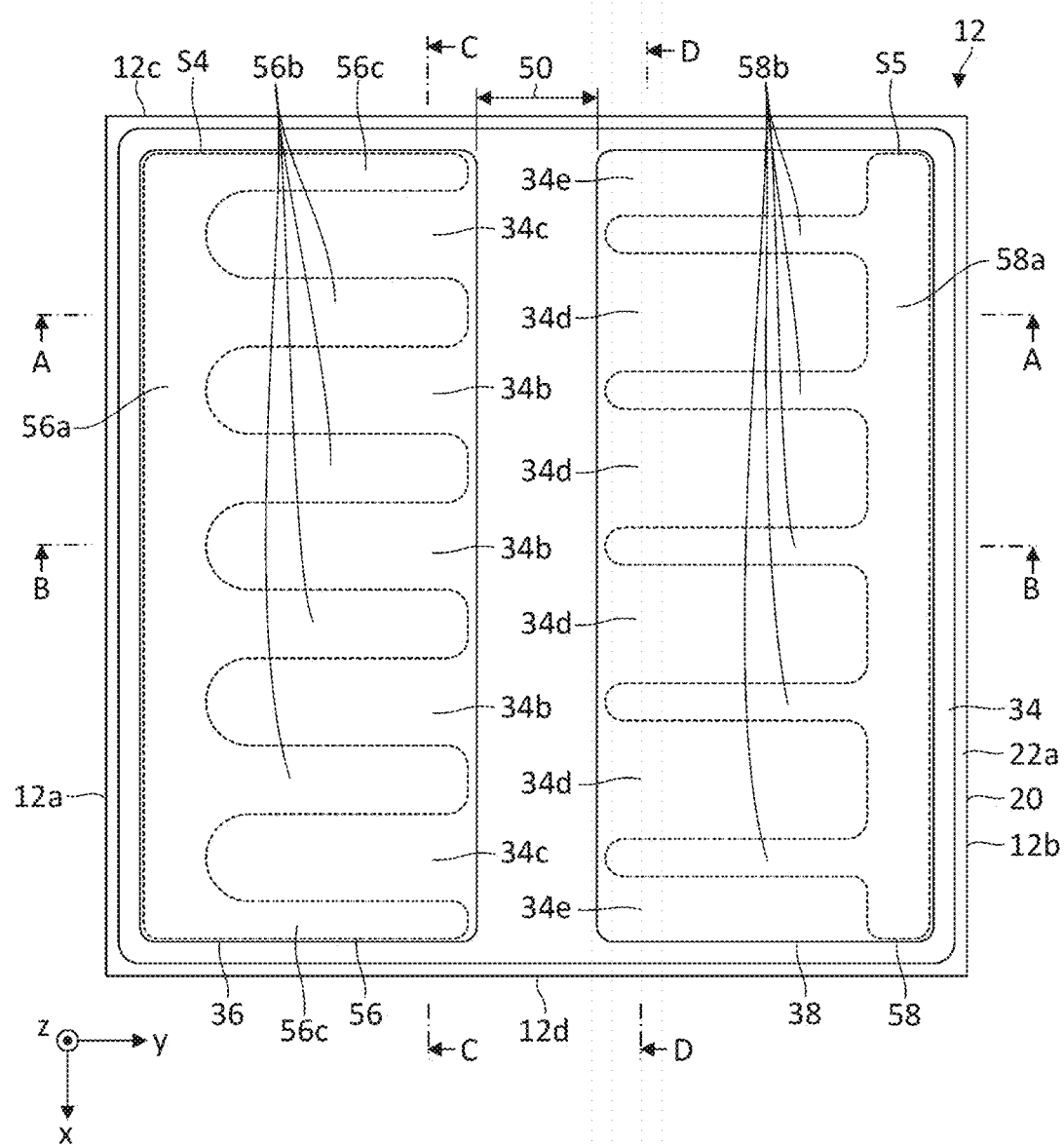
FIG. 6 is a top view schematically showing an arrangement of the p-side pad opening and the p-side pad electrode, and an arrangement of the n-side pad opening and the n-side pad electrode.

FIG. 6 is a top view schematically showing an arrangement of the p-side pad opening 56 and the p-side pad electrode 36, and an arrangement of the n-side pad opening 58 and the n-side pad electrode 38. FIG. 6 shows the positions of the p-side pad opening 56 and the n-side pad opening 58 by broken lines.

The p-side pad electrode 36 is provided to overlap the entirety of the p-side pad opening 56. The p-side pad electrode 36 is provided to overlap a protective layer 34b positioned between two adjacent p-side inner finger openings 56b. The p-side pad electrode 36 is provided to overlap a protective layer 34c positioned between the p-side inner finger opening 56b and the p-side outer finger opening 56c.

The n-side pad electrode 38 is provided to overlap the entirety of the n-side pad opening 58. The n-side pad electrode 38 is provided to overlap a protective layer 34d positioned between two adjacent n-side finger openings 58b. The n-side pad electrode 38 is provided to overlap a protective layer 34e positioned between the n-side finger opening 58b and the third side surface 12c or between the n-side finger opening 58b and the fourth side surface 12d.

Figure 7:
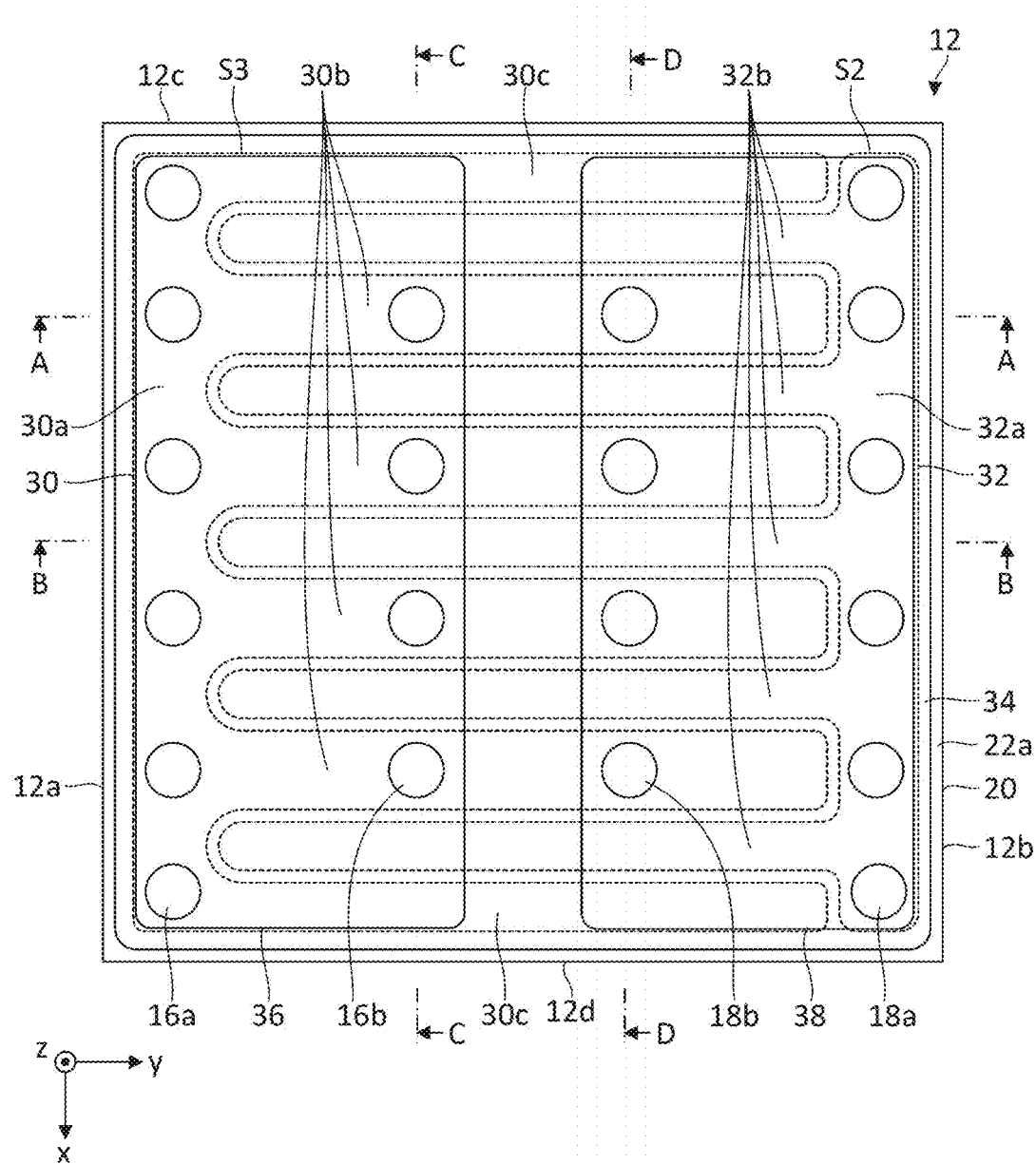
FIG. 7 is a top view schematically showing an arrangement of the p-side bump and the n-side bump.

FIG. 7 is a top view schematically showing an arrangement of the p-side bumps 16 and the n-side bumps 18. FIG. 7 shows the third comb tooth region S3 in which the p-side contact electrode 30 is provided and the second comb tooth region S2 in which the n-side contact electrode 32 is provided by broken lines. The p-side outer bumps 16a are provided at positions that overlap the p-side bus bar electrode 30a. The p-side inner bumps 16b are provided at positions that overlap the p-side inner finger electrodes 30b. The n-side outer bumps 18a are provided at positions that overlap the n-side bus bar electrode 32a. The n-side inner bumps 18b are provided at positions that overlap the p-side inner finger electrodes 30b.

FIG. 7 shows an arrangement of the p-side contact electrode 30, the n-side contact electrode 32, the p-side pad electrode 36, and the n-side pad electrode 38. The p-side pad electrode 36 is provided to overlap the p-side bus bar electrode 30a, the p-side inner finger electrodes 30b, the p-side outer finger electrodes 30c, and the n-side finger electrodes 32b. The n-side pad electrode 38 is provided to overlap the n-side bus bar electrode 32a, the n-side finger electrodes 32b, and the p-side inner finger electrodes 30b.

Figure 8:
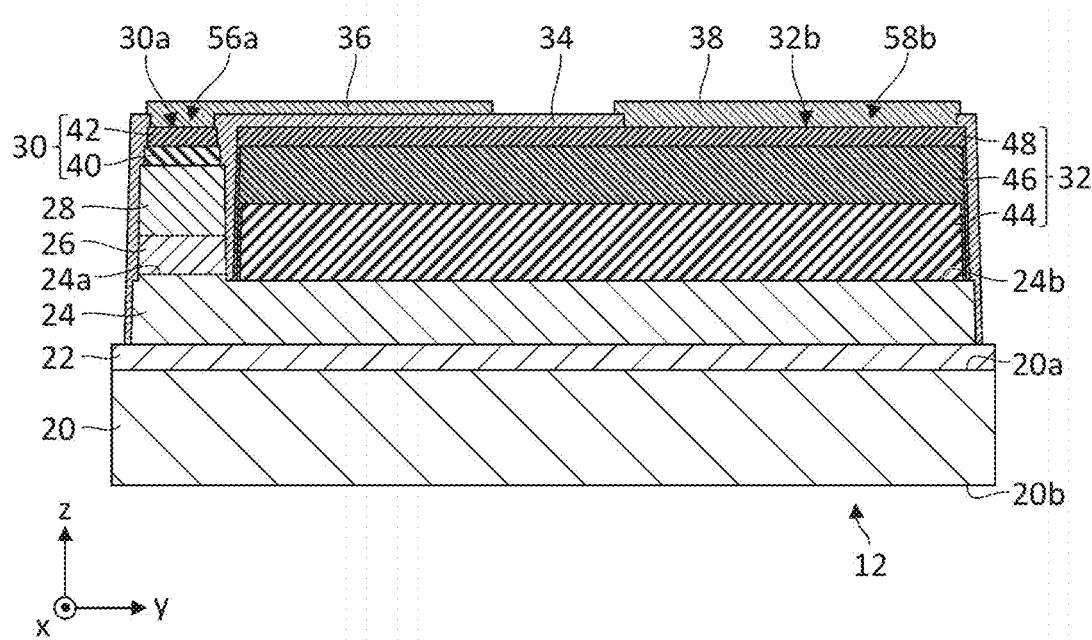
FIG. 8 is a cross-sectional view schematically showing a configuration of the semiconductor light-emitting element.

FIG. 8 is a cross-sectional view schematically showing a configuration of the semiconductor light-emitting element 12 and corresponds to a B-B cross section of FIG. 2. The p-side pad electrode 36 is connected to the p-side bus bar electrode 30a in the p-side bus bar opening 56a. The n-side pad electrode 38 is connected to the n-side finger electrode 32b in the n-side finger opening 58b.

Figure 9:
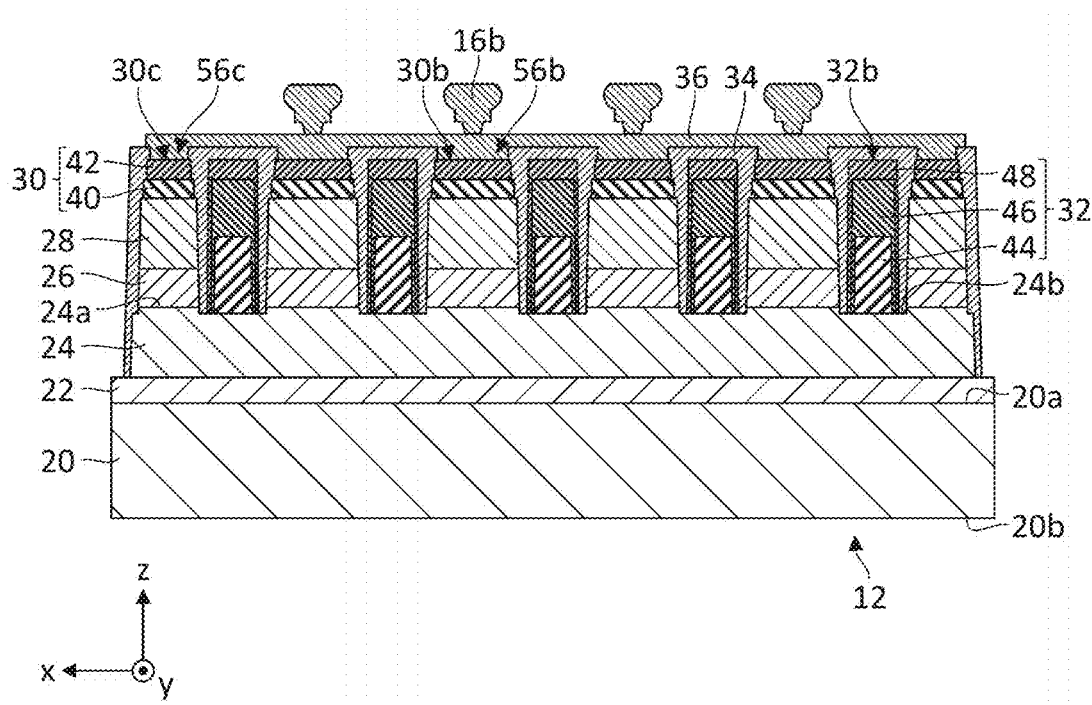
FIG. 9 is a cross-sectional view schematically showing a configuration of the semiconductor light-emitting element.

FIG. 9 is a cross-sectional view schematically showing a configuration of the semiconductor light-emitting element 12 and corresponds to a C-C cross section of FIG. 2. The p-side contact electrode 30 and the n-side contact electrode 32 are arranged alternately in the x direction. The p-side pad electrode 36 is connected to the p-side inner finger electrode 30b in the p-side inner finger opening 56b and is connected to p-side outer finger electrode 30c in the p-side outer finger opening 56c. The p-side inner bump 16b is provided at a position that overlaps the p-side inner finger electrode 30b. The protective layer 34 provides electrical insulation between the n-side finger electrode 32b and the p-side pad electrode 36.

Figure 10:
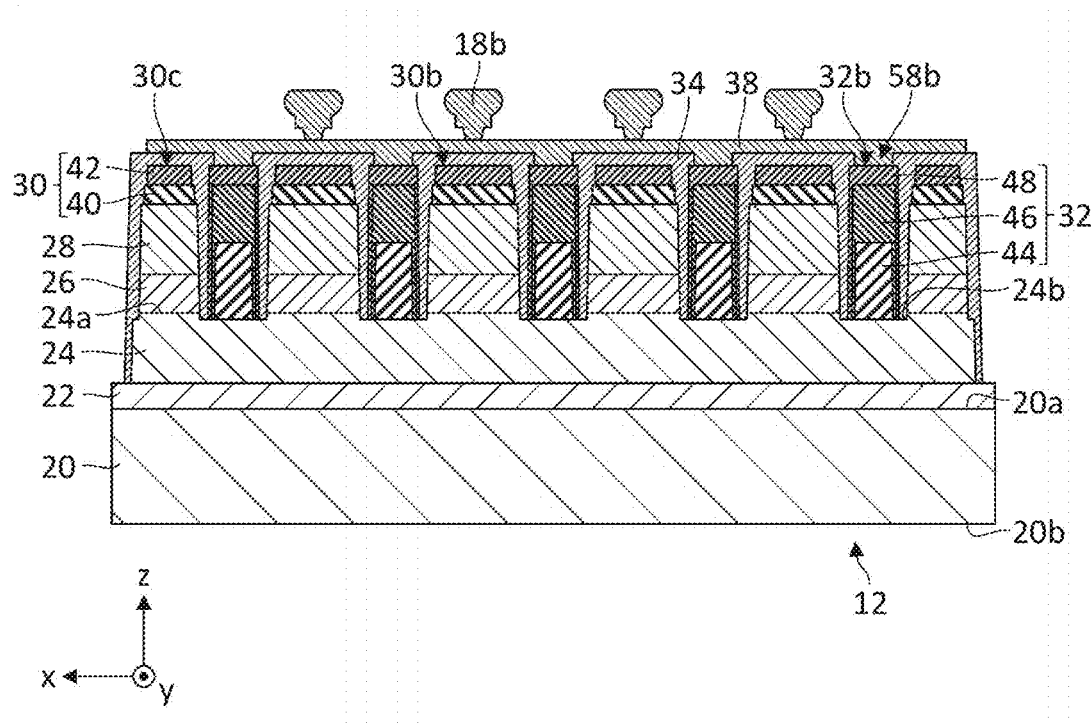
FIG. 10 is a cross-sectional view schematically showing a configuration of the semiconductor light-emitting element.

FIG. 10 is a cross-sectional view schematically showing a configuration of the semiconductor light-emitting element 12 and corresponds to a D-D cross section of FIG. 2. As similar in FIG. 9, the p-side contact electrode 30 and the n-side contact electrode 32 are arranged alternately in the x direction. The n-side pad electrode 38 is connected to the n-side finger electrode 32b in the n-side finger opening 58b. The n-side inner bump 18b is provided at a position that overlaps the p-side inner finger electrode 30b. The protective layer 34 provides electrical insulation between the p-side inner finger electrode 30b and the n-side pad electrode 38 and between the p-side outer finger electrode 30c and the n-side pad electrode 38.

Figure 11:
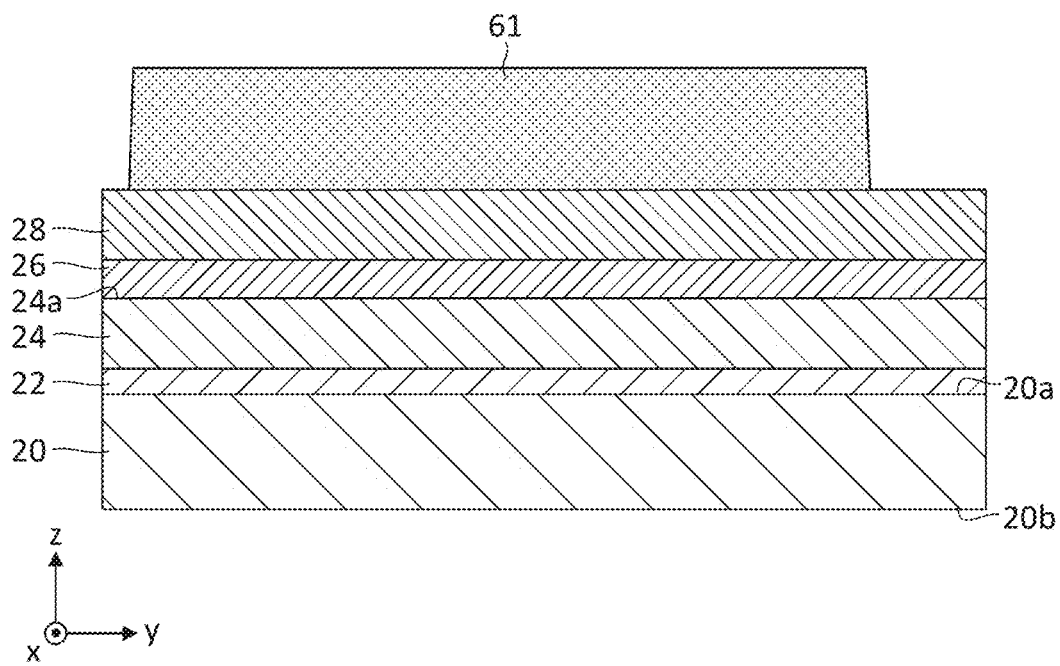
FIG. 11 schematically shows a step of manufacturing the semiconductor light-emitting element.

A description will now be given of a method of manufacturing the semiconductor light-emitting device 10. FIGS. 11-19 schematically show steps of manufacturing the semiconductor light-emitting element 12 and correspond to cross sections of FIG. 1 (i.e. A-A cross sections of FIG. 2). Referring to FIG. 11, the base layer 22, the n-type semiconductor layer 24, the active layer 26, and the p-type semiconductor layer 28 are formed on the first principal surface 20a of the substrate 20 successively. The active layer 26 is formed on the first upper surface 24a of the n-type semiconductor layer 24. The base layer 22, the n-type semiconductor layer 24, the active layer 26, and the p-type semiconductor layer 28 are formed on the entirety of the first principal surface 20a.

The substrate 20 is, for example, a patterned sapphire substrate. The base layer 22 includes, for example, an HT-AlN layer and an undoped AlGaN layer. The n-type semiconductor layer 24, the active layer 26, and the p-type semiconductor layer 28 are semiconductor layers made of an AlGaN-based semiconductor material, an AlN-based semiconductor material, or a GaN-based semiconductor material and can be formed by a well-known epitaxial growth method such as the metal organic vapor phase epitaxy (MOVPE) method and the molecular beam epitaxy (MBE) method.

A first mask 61 is then formed on the p-type semiconductor layer 28. The first mask 61 is an etching mask for forming the side surface (first mesa surface) of the active layer 26 and the p-type semiconductor layer 28. The first mask 61 can be formed by using a publicly known photolithographic technology. The first mask 61 is provided in the first comb tooth region S1 of FIG. 3. The side surface of the first mask 61 is sloped. The angle of slope of the side surface of the first mask 61 is defined such that the first mesa surface sloped at the first angle $\theta_1$ is formed in the subsequent etching step.

Figure 12:
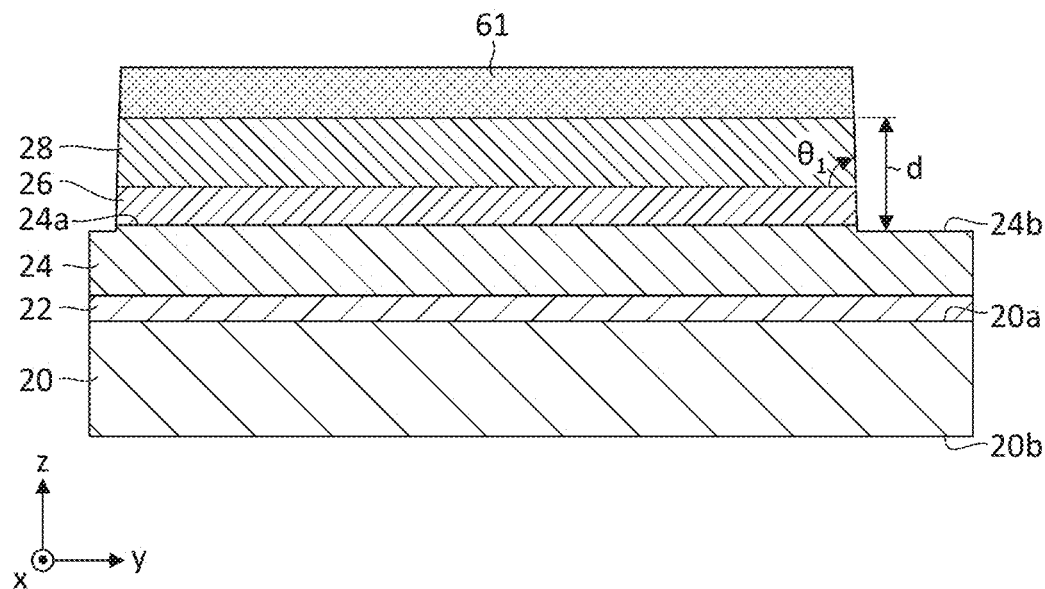
FIG. 12 schematically shows a step of manufacturing the semiconductor light-emitting element.

Subsequently, as shown in FIG. 12, the p-type semiconductor layer 28 and the active layer 26 are etched from above the first mask 61 to expose the n-type semiconductor layer 24 in a region that does not overlap the first mask 61. The etching depth d of this step corresponds to the total thickness of the active layer 26 and the p-type semiconductor layer 28 and is, for example, equal to or more than 400 nm and equal to or less than 1500 nm. This etching step forms the first mesa surface sloped at the first angle $\theta_1$ and forms the second upper surface 24b of the n-type semiconductor layer 24.

In the etching step of FIG. 12, reactive ion etching using a chlorine-based etching gas can be used, and inductive coupling plasma (ICP) etching can be used. A reactive gas including chlorine (Cl) such as chlorine ($Cl_2$), boron trichloride ($BCl_3$), and silicon tetrachloride ($SiCl_4$) can be used as the etching gas. Dry etching may be performed by combining a reactive gas and an inert gas, or a noble gas such as argon (Ar) may be mixed with the chlorine-based gas. The first mask 61 is removed after the first mesa surface and the second upper surface 24b are formed.

Figure 13:
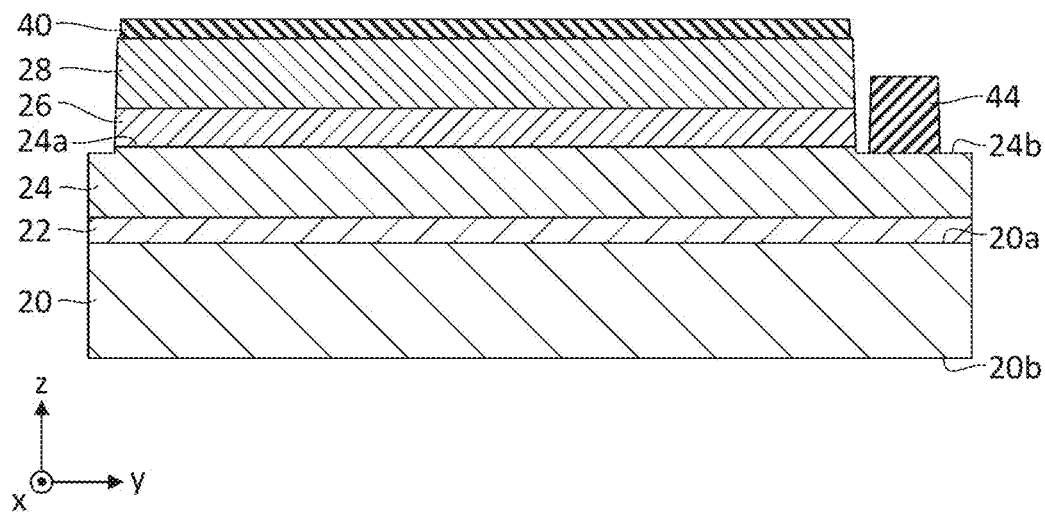
FIG. 13 schematically shows a step of manufacturing the semiconductor light-emitting element.

Subsequently, as shown in FIG. 13, the n-side contact layer 44 is formed on the second upper surface 24b of the n-type semiconductor layer 24, and the p-side contact layer 40 is formed on the upper surface of the p-type semiconductor layer 28. The sequence of forming the p-side contact layer 40 and the n-side contact layer 44 is not limited to any pattern. For example, the p-side contact layer 40 can be formed after the n-side contact layer 44 is formed. Alternatively, the n-side contact layer 44 may be formed after the p-side contact layer 40 is formed.

The n-side contact layer 44 is provided in the second comb tooth region S2 of FIG. 3. For example, the n-side contact layer 44 can be selectively formed in the second comb tooth region S2 by using a publicly known photolithographic technology and providing a resist mask in a portion outside the second comb tooth region S2. The n-side contact layer 44 is formed by, for example, stacking a Ti layer, an Al layer, a Ti layer, and a TiN layer sequentially. The layers forming the n-side contact layer 44 can be formed by sputtering or EB deposition.

The n-side contact layer 44 is annealed after the layers forming the n-side contact layer 44 are formed. Annealing of the n-side contact layer 44 is performed at a temperature lower than the melting point of Al (about 660° C.) and, for example, at a temperature equal to or more than 500° C. nm and equal to or less than 650° C. and, preferably, equal to or more than 550° C. nm and equal to or less than 625° C. Annealing ensures that the contact resistance of the n-side contact layer 44 is $1\times10^{-2}$ $\Omega\cdot cm^2$ or lower. The annealing temperature lower than the melting temperature of Al enhances the post-annealing flatness of the n-side contact layer 44 and produces an ultraviolet reflectivity of 80% or higher or 90% or higher.

The p-side contact layer 40 is provided in the third comb tooth region S3 of FIG. 4. For example, the p-side contact layer 40 can be selectively formed in the third comb tooth region S3 by using a publicly known photolithographic technology and providing a resist mask in a portion outside the third comb tooth region S3. The p-side contact layer 40 is made of, for example, ITO, and can be formed by sputtering. The p-side contact layer 40 is annealed after the ITO layer forming the p-side contact layer 40 is formed. Annealing ensures that the contact resistance of the p-side contact layer 40 is $1\times10^{-2}$ $\Omega\cdot cm^2$ or lower.

Figure 14:
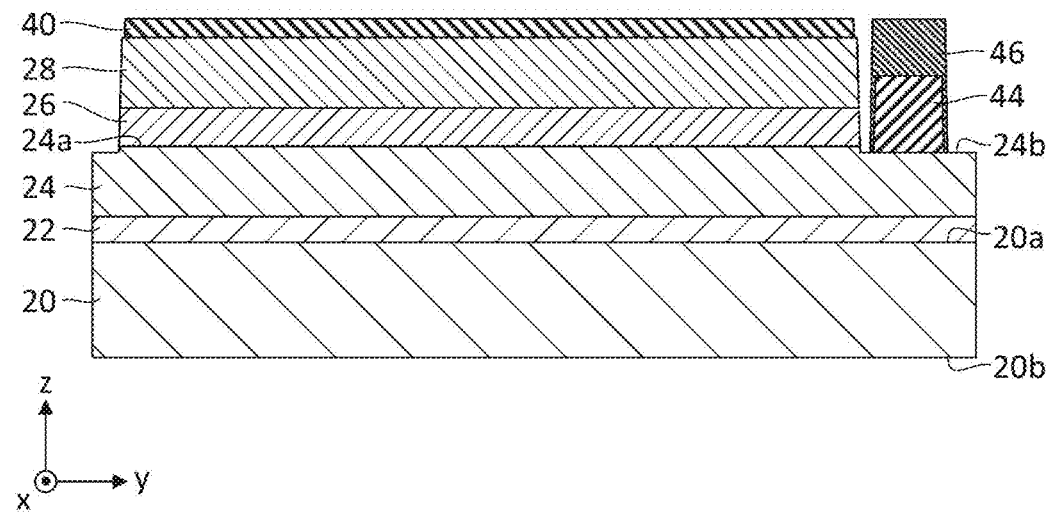
FIG. 14 schematically shows a step of manufacturing the semiconductor light-emitting element.

Subsequently, as shown in FIG. 14, the first current diffusion layer 46 is formed to cover the n-side contact layer 44. The first current diffusion layer 46 is provided in the second comb tooth region S2 of FIG. 3. For example, the first current diffusion layer 46 can be selectively formed in the second comb tooth region S2 by using a publicly known photolithographic technology and providing a resist mask in a portion outside the second comb tooth region S2. It is preferred that the first current diffusion layer 46 is formed in a region slightly larger than the footprint of the n-side contact layer 44 to cover the upper surface and the side surface of the n-side contact layer 44.

The first current diffusion layer 46 is formed on the n-side contact layer 44 after the annealing. The first current diffusion layer 46 is formed by stacking a first TiN layer, a metal layer, and a second TiN layer sequentially by, for example, sputtering or EB deposition. The first current diffusion layer 46 is formed to be aligned in height with the p-side contact layer 40. The difference between the height of the upper surface of the p-side contact layer 40 and the height of the upper surface of the first current diffusion layer 46 is 100 nm or smaller or 50 nm or smaller.

Figure 15:
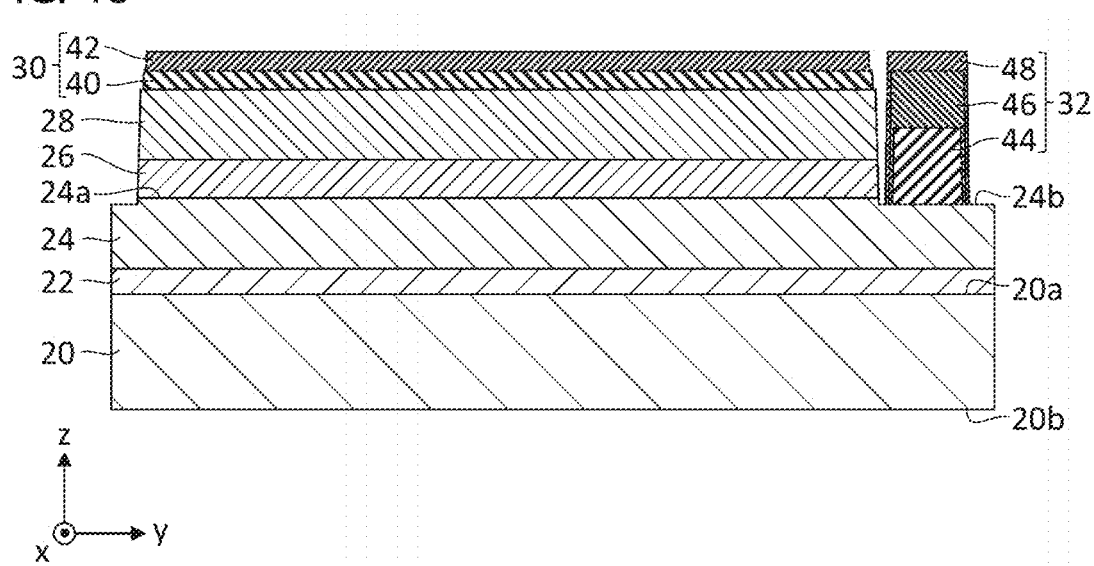
FIG. 15 schematically shows a step of manufacturing the semiconductor light-emitting element.

Subsequently, as shown in FIG. 15, the second current diffusion layer 48 is formed to cover the first current diffusion layer 46, and the p-side current diffusion layer 42 is formed on the p-side contact layer 40. The p-side current diffusion layer 42 and the second current diffusion layer 48 can be formed concurrently. Forming the p-side current diffusion layer 42 and the second current diffusion layer 48 concurrently ensures that the p-side current diffusion layer 42 and the second current diffusion layer 48 have the same thickness, and that the upper surfaces of the p-side current diffusion layer 42 and the second current diffusion layer 48 are aligned in height.

The second current diffusion layer 48 is provided in the second comb tooth region S2 of FIG. 3. The p-side current diffusion layer 42 is provided in the third comb tooth region S3 of FIG. 4. For example, the second current diffusion layer 48 can be selectively formed in the second comb tooth region S2, and the p-side current diffusion layer 42 can be selectively formed in the third comb tooth region S3 by using a publicly known photolithographic technology and providing a resist mask in portions outside the second comb tooth region S2 and the third comb tooth region S3. It is preferred that the second current diffusion layer 48 is formed in a region slightly larger than the footprint of the first current diffusion layer 46 to cover the upper surface and the side surface of the first current diffusion layer 46. Meanwhile, it is preferred that the p-side current diffusion layer 42 is formed in a region slightly smaller than the footprint of the p-side contact layer 40 to be formed only on the upper surface of the p-side contact layer 40. The n-side contact layer 44 and the second current diffusion layer 48 are formed by stacking a first TiN layer, a metal layer, and a second TiN layer sequentially by, for example, sputtering or EB deposition.

The p-side current diffusion layer 42 and the second current diffusion layer 48 may be formed separately instead of concurrently. For example, a mask for forming the p-side current diffusion layer 42 may be used to form the p-side current diffusion layer 42, and then a mask for forming the second current diffusion layer 48 may be used to form the second current diffusion layer 48. The sequence of forming the p-side current diffusion layer 42 and the second current diffusion layer 48 is not limited to a particular pattern, and the p-side current diffusion layer 42 may be formed after the second current diffusion layer 48 is formed. For example, the first current diffusion layer 46 and the second current diffusion layer 48 may be formed successively, and the then the p-side current diffusion layer 42 may be formed.

Figure 16:
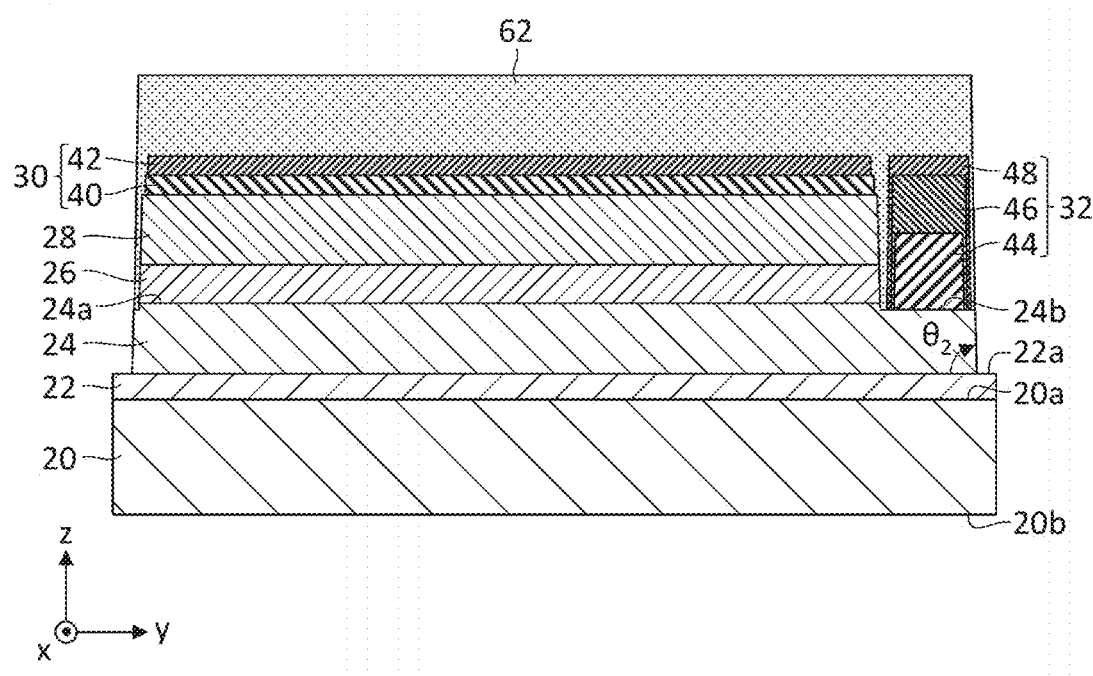
FIG. 16 schematically shows a step of manufacturing the semiconductor light-emitting element.

Subsequently, as shown in FIG. 16, a second mask 62 is formed to cover the active layer 26, the p-type semiconductor layer 28, the p-side contact electrode 30, and the n-side contact electrode 32p. The range in which the second mask 62 corresponds to the range in which the n-type semiconductor layer 24 of FIG. 3 is formed, i.e., the region inside the outer edge 24c of the n-type semiconductor layer 24. The second mask 62 can be formed by using a publicly known photolithographic technology. The n-type semiconductor layer 24 is then etched from above the second mask 62 to expose the upper surface 22a of the base layer 22 in a region that does not overlap the second mask 62. This etching step forms the side surface (second mesa surface) of the n-type semiconductor layer 24 sloped at the second angle $\theta_2$. The n-type semiconductor layer 24 can be dry-etched by using a chlorine-based gas or a mixture gas containing a chlorine-based gas and a noble gas. After the second mesa surface is formed, the second mask 62 is removed.

Figure 17:
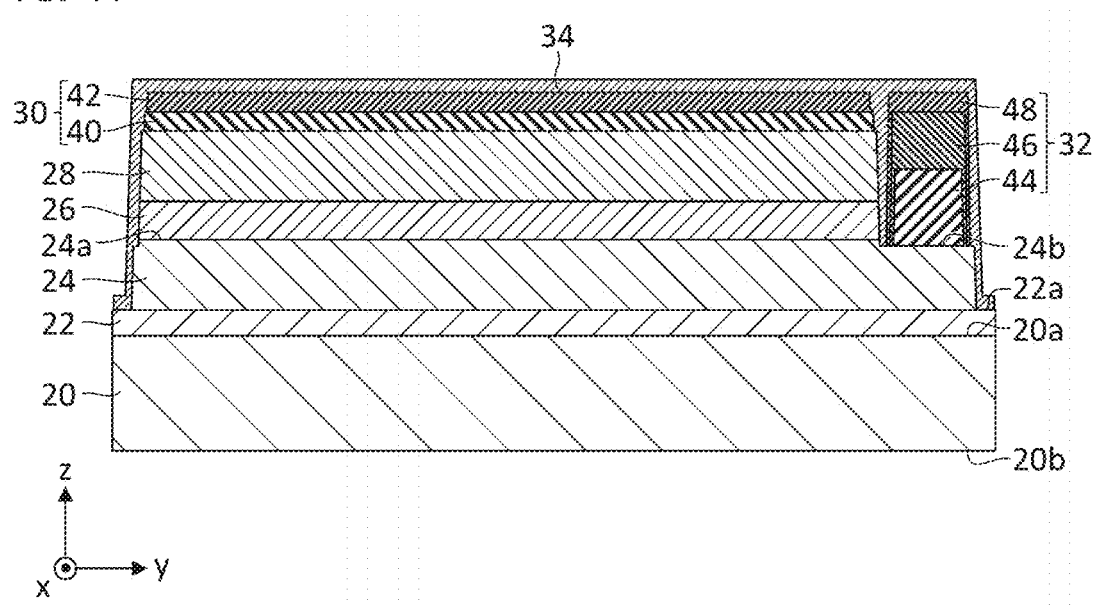
FIG. 17 schematically shows a step of manufacturing the semiconductor light-emitting element.

Subsequently, as shown in FIG. 17, the protective layer 34 is formed to cover the side surface (second mesa surface) of the n-type semiconductor layer 24, the side surface (first mesa surface) of the active layer 26 and the p-type semiconductor layer 28, the p-side contact electrode 30, and the n-side contact electrode 32. The protective layer 34 is formed to cover the entirety of the element structure above the base layer 22. The protective layer 34 is made of, for example, $SiO_2$ or SiON and can be formed by a well-known technology such as chemical vapor deposition (CVD).

Figure 18:
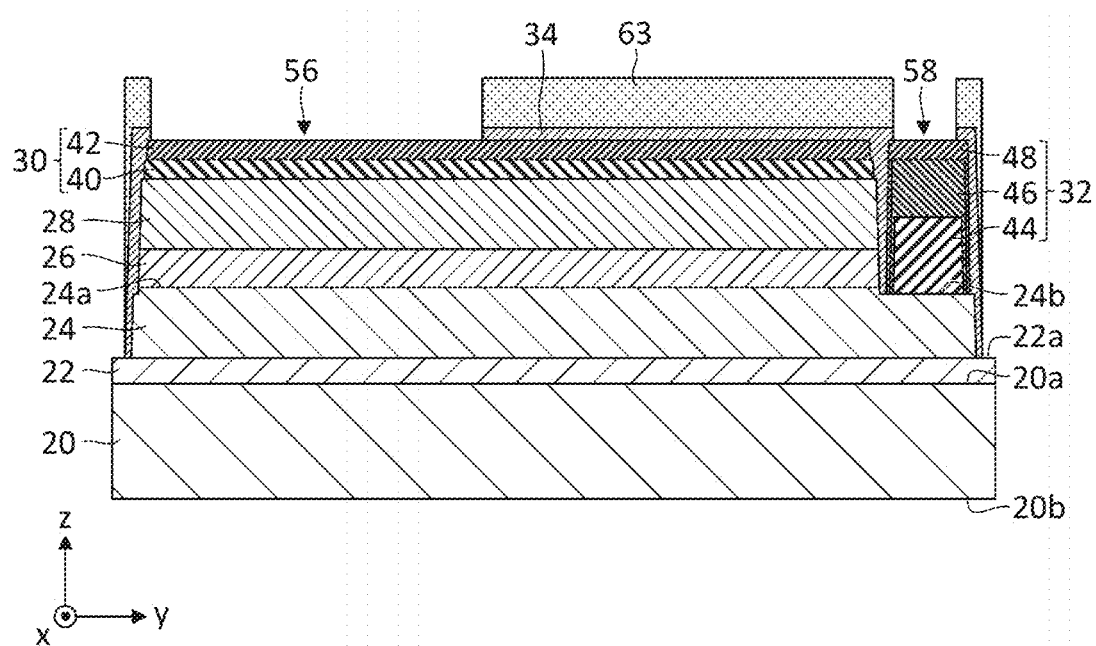
FIG. 18 schematically shows a step of manufacturing the semiconductor light-emitting element.

Subsequently, as shown in FIG. 18, a third mask 63 is formed on the protective layer 34 to remove the protective layer 34 in a portion in which the third mask 63 is not provided. The third mask 63 is provided in a portion outside the fourth comb tooth region S4 and the fifth comb tooth region S5 of FIG. 6. The protective layer 34 can be dry-etched by using a CF-based etching gas. For example, hexafluoroethane ($C_2F_6$) can be used. This etching step forms the p-side pad opening 56 in which the p-side contact electrode 30 is exposed and the n-side pad opening 58 in which the n-side contact electrode 32 is exposed.

The third mask 63 may be formed to exclude the outer circumference region in which the upper surface 22a of the base layer 22 is exposed. In this case, the upper surface 22a of the base layer 22 may be exposed in the outer circumferential region in the step of etching the protective layer 34. The outer circumferential region corresponds to the element separation area provided when a plurality of semiconductor light-emitting elements 12 are formed from a single substrate. The third mask 63 is removed after the protective layer 34 is etched.

In the dry-etching step shown in FIG. 18, the p-side current diffusion layer 42 and the second current diffusion layer 48 function as an etching stop layer. More specifically, the second TiN layer of the p-side current diffusion layer 42 and the second current diffusion layer 48 functions as an etching stop layer. TiN is not so reactive to a fluorine-based etching gas for removing the protective layer 34 so that by-products from etching are not easily produced. Therefore, a damage to the p-side contact electrode 30 and the n-side contact electrode 32 can be prevented in the step of etching the protective layer 34. As a result, the exposed surface of the p-side contact electrode 30 in the p-side pad opening 56 and the exposed surface of the n-side contact electrode 32 in the n-side pad opening 58 can be maintained at a high quality.

Figure 19:
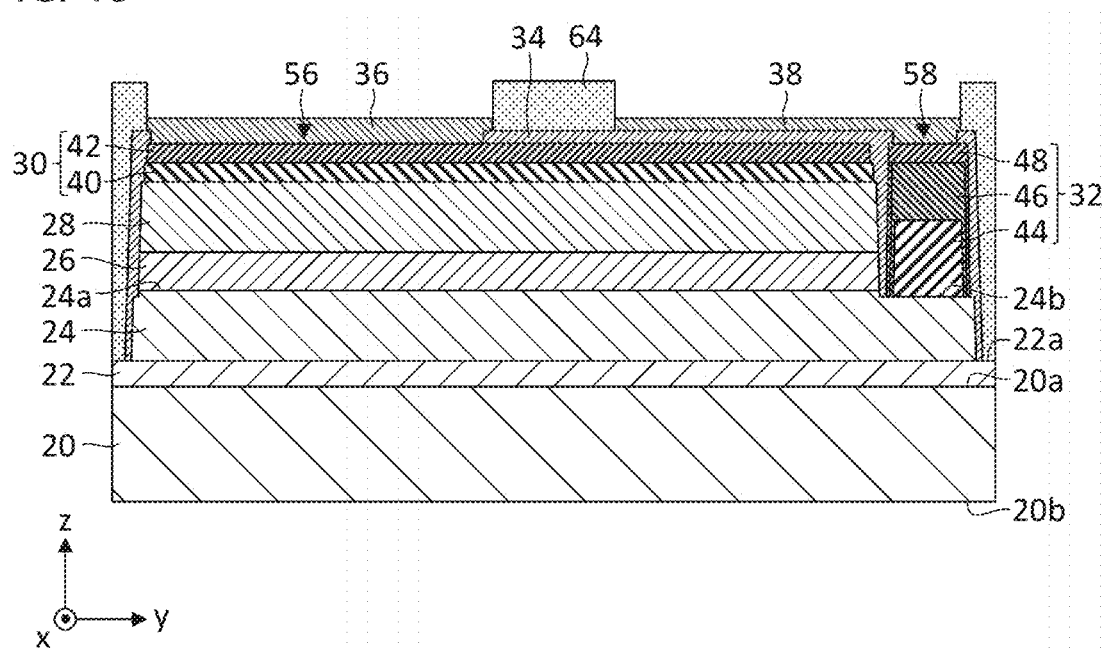
FIG. 19 schematically shows a step of manufacturing the semiconductor light-emitting element.

Subsequently, as shown in FIG. 19, a fourth mask 64 is formed on the protective layer 34, and the p-side pad electrode 36 and the n-side pad electrode 38 are formed in portions in which the fourth mask 64 is not provided. The p-side pad electrode 36 is formed on the p-side contact electrode 30 and the protective layer 34 to block the entirety of the p-side pad opening 56 and is connected to the p-side contact electrode 30. The n-side pad electrode 38 is formed on the n-side contact electrode 32 and the protective layer 34 to block the entirety of the n-side pad opening 58 and is connected to the n-side contact electrode 32. The p-side pad electrode 36 and the n-side pad electrode 38 can be formed by, for example, stacking an Ni layer or a Ti layer on the p-side current diffusion layer 42 or the second current diffusion layer 48 and stacking an Au layer on the Ni layer or the Ti layer. After the p-side pad electrode 36 and the n-side pad electrode 38 are formed, the fourth mask 64 is removed.

The p-side pad electrode 36 and the n-side pad electrode 38 may be formed concurrently or formed separately. For example, a mask for forming the p-side pad electrode 36 may be used to form the p-side pad electrode 36, and then a mask for forming the n-side pad electrode 38 may be used to form the n-side pad electrode 38. The sequence of forming the p-side pad electrode 36 and the n-side pad electrode 38 is not limited to a particular pattern, and the p-side pad electrode 36 may be formed after the n-side pad electrode 38 is formed.

The semiconductor light-emitting element 12 of FIG. 1 is completed through the steps described above.

A description will now be given of a step of bonding the semiconductor light-emitting element 12 to the packaging substrate 14. First, the p-side bumps 16 and the n-side bumps 18 are formed on the packaging substrate 14. The p-side bumps 16 are formed on the p-side packaging electrode 14p, and the n-side bumps 18 are formed on the n-side packaging electrode 14n. The p-side bumps 16 and the n-side bumps 18 are so-called Au stud bumps and can be formed by melting the end of an Au wire and turning it into a ball and pressing the ball against the p-side packaging electrode 14p or the n-side packaging electrode 14n.

The semiconductor light-emitting element 12 is placed on the p-side bumps 16 and the n-side bumps 18. The semiconductor light-emitting element 12 is positioned such that the p-side pad electrode 36 is in contact with the p-side bumps 16 and the n-side pad electrode 38 is in contact with the n-side bumps 18. It is preferred that the semiconductor light-emitting element 12 is positioned such that the p-side outer bumps 16a overlap the p-side bus bar electrode 30a, the n-side outer bumps 18a overlap the n-side bus bar electrode 32a, and the p-side inner bumps 16b and the n-side inner bumps 18b overlap the p-side inner finger electrodes 30b. By then applying ultrasonic vibration to the semiconductor light-emitting element 12 and the packaging substrate 14, the p-side bumps 16 are ultrasonically bonded to the p-side packaging electrode 14p, and the n-side bumps 18 are ultrasonically bonded to the n-side packaging electrode 14n. The method of bonding the semiconductor light-emitting element 12 to the packaging substrate 14 is not limited to ultrasonic bonding, and an arbitrary bonding technology may be used. This completes the semiconductor light-emitting device 10 of FIG. 1.

The semiconductor light-emitting element 12 may be bonded to or packaged on the packaging substrate 14 without using the p-side bumps 16 and the n-side bumps 18. The semiconductor light-emitting element 12 and the packaging substrate 14 may be bonded by using a solder material such as gold-tin (AuSn). For example, an AuSn layer may be formed on the surface of the p-side pad electrode 36 and the n-side pad electrode 38 of the semiconductor light-emitting element 12, and the AuSn layer may be melted while the semiconductor light-emitting element 12 is placed on the packaging substrate 14 so as to bond the semiconductor light-emitting element 12 and the packaging substrate 14 to each other. The AuSn layer may be provided on the surface of the n-side packaging electrode 14n and the p-side packaging electrode 14p of the packaging substrate 14 or may be provided both on the semiconductor light-emitting element 12 and the packaging substrate 14. Alternatively, the semiconductor light-emitting element 12 and the packaging substrate 14 may be bonded to each other by placing an AuSn preform between the semiconductor light-emitting element 12 and the packaging substrate 14 and melting the preform.

According to this embodiment, uniform light distribution of the active layer 26 can be produced by configuring the p-side contact electrode 30 and the n-side contact electrode 32 to have a comb tooth shape and configuring the p-side contact electrode 30 and the n-side contact electrode 32 to alternate in the first direction (x direction). In the case of the semiconductor light-emitting element 12 of flip chip type like that of this embodiment, the light emission intensity in the outer circumferential part of the active layer 26 adjacent to the n-side contact electrode 32 tends to be high, and the light emission intensity in the central part of the active layer 26 distanced from the n-side contact electrode 32 tends to be low. In this embodiment, the distance from the n-side contact electrode 32 to the central part of the active layer 26 can be reduced by configuring the active layer 26 to have a comb tooth shape and reducing the widths $w_{1a}$, $w_{1b}$, and $w_{1c}$ of the active layer 26. This inhibits the light emission intensity in the central part of the active layer 26 from dropping and results in uniform light emission distribution of the active layer 26. By producing uniform light emission intensity of the active layer 26, droop phenomenon in which the light emission efficiency drops at high current is inhibited, and the light emission efficiency of the semiconductor light-emitting element 12 can be improved.

According to this embodiment, the area occupied by the active layer 26 can be enlarged by providing the active layer 26 along the three side surfaces 12a, 12c, and 12d of the semiconductor light-emitting element 12. In other words, providing the active layer 26 with the outer finger part 26c enlarges the proportion of the area of the active layer 26 as compared with the case in which the n-side contact electrode 32 is provided along the third side surface 12c and the fourth side surface 12d. This can increase the light emission area of the semiconductor light-emitting element 12 and improve the light emission efficiency.

According to this embodiment, the amount of light emitted per a unit area of the semiconductor light-emitting element 12 can be increased by configuring the width $w_{1c}$ of the outer finger part 26c of the active layer 26 to be smaller than the width $w_{1b}$ of the inner finger part 26b. The light emission intensity in the portion of the outer finger part 26c of the active layer 26 adjacent to the n-side finger electrode 32b is high, and the light emission intensity in the portion adjacent to the third side surface 12c or the fourth side surface 12d is low. By reducing the width $w_{1c}$ of the outer finger part 26c of the active layer 26, the proportion of the area in the active layer 26 in which the light emission intensity drops can be reduced.

According to this embodiment, by configuring the p-side pad opening 56 and the n-side pad opening 58 to have a comb shape, the current can be efficiently supplied to the p-side contact electrode 30 and the n-side contact electrode 32 having a comb tooth shape. In the case the p-side pad opening is provided only in a portion corresponding to the p-side bus bar electrode 30a, for example, the amount of current supplied to the end of the p-side inner finger electrodes 30b and the p-side outer finger electrodes 30c distanced from the p-side bus bar electrode 30a will drop. Similarly, when the n-side pad opening is provided only in a portion corresponding to the n-side bus bar electrode 32a, the amount of current supplied to the end of the n-side finger electrodes 32b distanced from the n-side bus bar electrode 32a will drop. According to this embodiment, on the other hand, the amount of current supplied to the end of the p-side inner finger electrodes 30b and the p-side outer finger electrodes 30c is inhibited from dropping by also providing the p-side pad opening 56 at positions that overlap the p-side inner finger electrodes 30b and the p-side outer finger electrodes 30c. Further, by providing the n-side pad opening 58 also at a position that overlaps the n-side finger electrodes 32b, the amount of current supplied to the end of the n-side finger electrode 32b is inhibited from dropping. This further enhances the uniformity of light emission distribution of the semiconductor light-emitting element 12 and further improves the light emission efficiency.

According to this embodiment, the current can be supplied efficiently to the p-side inner finger electrodes 30b and the p-side outer finger electrodes 30c by providing the p-side inner bumps 16b. Similarly, the current can be supplied efficiently to the n-side finger electrodes 32b by providing the n-side inner bumps 18b. This further enhances the uniformity of light emission distribution of the semiconductor light-emitting element 12 and further improves the light emission efficiency.

According to this embodiment, the strength of bonding between the semiconductor light-emitting element 12 and the packaging substrate 14 can be enhanced by providing the p-side inner bumps 16b and the n-side inner bumps 18b at positions that overlap the p-side inner finger electrodes 30b, i.e., in the inner finger part 26b of the active layer 26. The active layer 26 is epitaxially grown and formed on the substrate 20 so has a relatively high mechanical strength. Further the width $w_{1b}$ of the inner finger part 26b of the active layer 26 is larger than the width $w_{1c}$ of the outer finger part 26c or the width $w_{2b}$ of the n-side finger electrode 32b so that the mechanical strength of the inner finger part 26b is relatively high. By providing the p-side inner bumps 16b and the n-side inner bumps 18b in these portions having a high mechanical strength, the strength of bonding between the semiconductor light-emitting element 12 and the packaging substrate 14 can be enhanced, and the reliability of the semiconductor light-emitting device 10 can be improved.

According to this embodiment, the current injected from the p-side pad electrode 36 can be diffused in the lateral direction (horizontal direction) by providing the p-side current diffusion layer 42, and the light emission area of the active layer 26 can be increased. This can enhance the light output of the semiconductor light-emitting element 12.

According to this embodiment, the function of sealing the n-side contact layer 44 can be further enhanced by covering the n-side contact layer 44 with the first current diffusion layer 46 and the second current diffusion layer 48. This prevents the Al layer included in the n-side contact layer 44 from being corroded by oxidation, etc. when the current is induced. As a result, the ultraviolet light reflectivity of the n-side contact layer 44 is inhibited from dropping, the function of the n-side contact layer 44 as a reflection electrode can be maintained for a long period of time, and the light output is inhibited from dropping in use when the current is induced. In other words, the semiconductor light-emitting element 12 capable maintaining a high light output for a long period of time can be realized.

According to this embodiment, high conductivity is realized, and migration of metal can be prevented by using a stack structure in which a TiN layer, a metal layer, and a TiN layer are stacked sequentially is used as the p-side current diffusion layer 42, the first current diffusion layer 46, and the second current diffusion layer 48. Specifically, migration of metal can be prevented by using the TiN layer, and conductivity can be enhanced by placing a metal layer between the TiN layer and the TiN layer.

According to this embodiment, the height of the upper surface of the p-side contact layer 40 and the height of the upper surface of the first current diffusion layer 46 can be aligned by providing the first current diffusion layer 46. In this embodiment, the thickness from the second upper surface 24b of the n-type semiconductor layer 24 to the upper surface 28a of the p-type semiconductor layer 28a is as large as about 400 nm-1500 nm, so that the p-side pad electrode 36 and the n-side pad electrode 38 would differ significantly in height unless the first current diffusion layer 46 for height adjustment is provided. If the difference in height between the p-side pad electrode 36 and the n-side pad electrode 38 is large, an uneven force may be applied when the p-side pad electrode 36 and the n-side pad electrode 38 are bonded to the packaging substrate 14 by using the p-side bumps 16 and the n-side bumps 18, creating a damage to the semiconductor light-emitting element 12. In particular, the difference in height between the p-side pad electrode 36 and the n-side pad electrode 38 of equal to or more than 200 nm and equal to or less than 500 nm tends to increase the percentage of rejects when the element is packaged. According to this embodiment, the difference in height between the p-side pad electrode 36 and the n-side pad electrode 38 can be controlled to be 100 nm or smaller and the percentage of rejects at packaging can be reduced by ensuring that the difference between the height of the upper surface of the p-side contact layer 40 and the height of the upper surface of the first current diffusion layer 46 is 100 nm or smaller.

According to this embodiment, it is ensured that an even force is applied to the p-side contact layer 40 and the first current diffusion layer 46 when the semiconductor light-emitting element 12 is packaged and that the percentage of rejects at packaging is reduced, by ensuring that the p-side current diffusion layer 42 and the second current diffusion layer 48 have substantially the same structure and thickness.

According to this embodiment, the adhesiveness to the protective layer 34 made of a dielectric material can be enhanced by using a TiN layer in the p-side current diffusion layer 42, the first current diffusion layer 46, and the second current diffusion layer 48. This prevents the sealing function from being impaired as a result of the protective layer 34 peeling from the p-side contact electrode 30 or the n-side contact electrode 32. This realizes the semiconductor light-emitting element 12 in which the light output does not drop easily over a long period of time.

According to this embodiment, by performing an annealing process while the TiN layer is provided on the metal layer of the n-side contact layer 44, oxidation of the metal layer is prevented from occurring in the annealing process. This prevents the ultraviolet reflectivity of the n-side contact layer 44 from dropping and prevents the flatness of the upper surface of the n-side contact layer 44 from dropping.

According to this embodiment, the first current diffusion layer 46 and the second current diffusion layer 48 are prevented from degraded by the annealing process, by forming the first current diffusion layer 46 and the second current diffusion layer 48 after annealing the n-side contact layer 44. Similarly, the p-side current diffusion layer 42 is prevented from being degraded due to the annealing process by forming the p-side current diffusion layer 42 after the p-side contact layer 40 is annealed.

Second Embodiment

Figure 20:
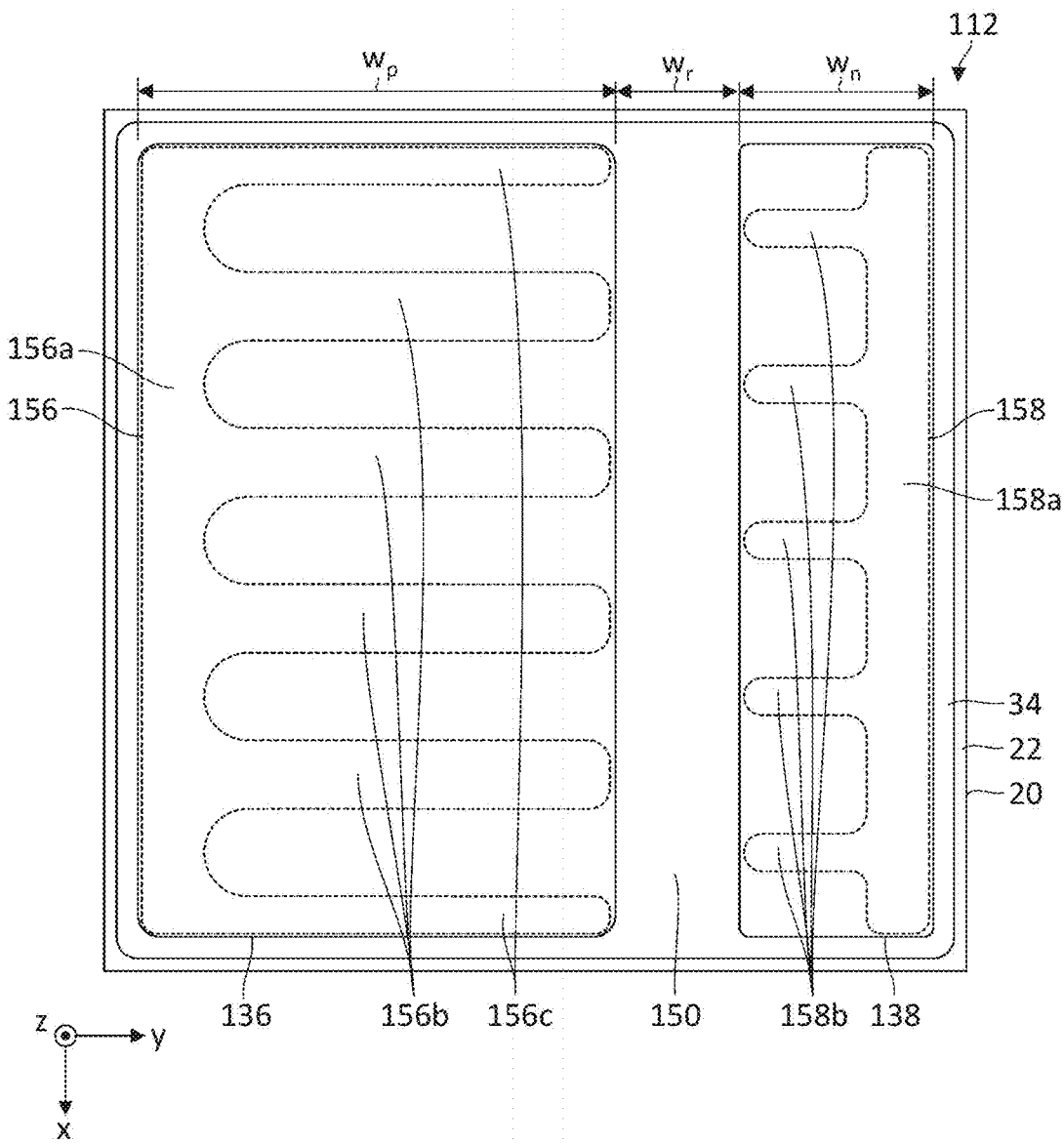
FIG. 20 is a top view schematically showing a configuration of the semiconductor light-emitting element according to the second embodiment.

FIG. 20 is a top view schematically showing a configuration of the semiconductor light-emitting element 12 according to the second embodiment and corresponds to FIG. 6 described above. In the second embodiment, the ranges in which a p-side pad electrode 136, an n-side pad electrode 138, a p-side pad opening 156, and an n-side pad opening 158 are formed are changed from those of the first embodiment. The other features of the second embodiment are identical to those of the first embodiment.

In the second embodiment, the width $w_p$ of the p-side pad electrode 136 in the second direction (y direction) is increased and the width $w_n$ of the n-side pad electrode 138 in the second direction (y direction) is reduced as compared with the first embodiment. The width $w_p$ of the p-side pad electrode 136 is 1.5 times the width $w_n$ of the n-side pad electrode 138 or larger and is about 2-4 times the width $w_n$. The range in which the p-side pad opening 156 is formed is increased in the second direction (y direction) to correspond to the area in which the p-side pad electrode 136 is formed. More specifically, the length of a p-side inner finger opening 156b and a p-side outer finger opening 156c in the second direction (y direction) is configured to be larger than that of the first embodiment. Meanwhile, the range in which the n-side pad opening 158 is formed is reduced in the second direction (y direction) to correspond to the range in which the p-side pad electrode 136 is formed. More specifically, the length of an n-side pad opening 158b in the second direction (y direction) is configured to be larger than that of the first embodiment.

The second embodiment provides the same advantage as the first embodiment described above. In further accordance with the second embodiment, the current can be supplied to the entirety of the active layer 26 more uniformly by enlarging the range in which the p-side pad electrode 136 and the p-side pad opening 156 are formed. In particular, the current can be efficiently supplied to the end of the inner finger part 26b and the outer finger part 26c of the active layer 26. This can improve the light emission distribution of the active layer 26.

Described above is an explanation based on an exemplary embodiment. The embodiment is intended to be illustrative only and it will be understood by those skilled in the art that various design changes are possible and various modifications are possible and that such modifications are also within the scope of the present invention.

In one embodiment, at least one of the first current diffusion layer 46 and the second current diffusion layer 48 is provided in a region larger than the footprint of the n-side contact layer 44. For example, the first current diffusion layer 46 may be provided in a region larger than the n-side contact layer 44, and the second current diffusion layer 48 may be provided in a region that matches the n-side contact layer 44 or in a region smaller than the n-side contact layer 44. Alternatively, the first current diffusion layer 46 may be provided in a region that matches the n-side contact layer 44 or in a region smaller than the n-side contact layer 44, and the second current diffusion layer 48 may be provided in a region larger than the n-side contact layer 44. Further, the first current diffusion layer 46 and the second current diffusion layer 48 may both be provided in a region larger than the n-side contact layer 44. In this case, the footprint of the second current diffusion layer 48 may match the footprint of the first current diffusion layer 46, may be larger than the footprint of the first current diffusion layer 46, or may be smaller than the footprint of the first current diffusion layer 46.

In the embodiments described above, it is shown that the first current diffusion layer 46 and the second current diffusion layer 48 are provided on the n-side contact layer 44. In an alternative embodiment, a single n-side current diffusion layer may be provided on the n-side contact layer 44 instead of providing the first current diffusion layer 46 and the second current diffusion layer 48. The n-side current diffusion layer may be provided with only one stack structure including the first TiN layer, the metal layer, and the second TiN layer. It is preferred that the difference between the height of the upper surface of the n-side current diffusion layer and the height of the upper surface of the p-side current diffusion layer 42 is 100 nm or smaller. The n-side current diffusion layer may be provided with three or more stack structures each including the first TiN layer, the metal layer, and the second TiN layer. Further, the p-side current diffusion layer 42 may be provided with two or more stack structures each including the first TiN layer, the metal layer, and the second TiN layer.

In the embodiments described above, it is shown that a transparent conductive oxide such as ITO is used in the p-side contact layer 40. In an alternative embodiment, a structure in which a platinum group metal layer of rhodium (Rh), etc. and a TiN layer covering the upper surface and the side surface of the platinum group metal layer are stacked may be used as the p-side contact layer 40.

In the embodiments described above, it is shown that the thickness of the p-type semiconductor layer 28 is 400 nm or larger. In an alternative embodiment, the thickness of the p-type semiconductor layer 28 may be 100 nm or smaller. When Rh is used in the p-side contact layer 40, in particular, the thickness of the p-type semiconductor layer 28 may be 100 nm or smaller. In this case, the height from the second upper surface 24b of the n-type semiconductor layer 24 to the upper surface of the p-type semiconductor layer 28 will be small so that it is not necessary to provide the first current diffusion layer 46 for height adjustment.

What is claimed is:

1. A semiconductor light-emitting device comprising:
   an n-type semiconductor layer made of an n-type AlGaN-based semiconductor material;
   an active layer provided in a first comb tooth region on the n-type semiconductor layer and made of an AlGaN-based semiconductor material;
   a p-type semiconductor layer provided on the active layer;
   an n-side contact electrode provided in a second comb tooth region on the n-type semiconductor layer inserted in the first comb tooth region;
   a p-side contact electrode provided in a third comb tooth region on the p-type semiconductor layer;
   a protective layer having a p-side pad opening provided in a fourth comb tooth region on the p-side contact electrode and an n-side pad opening provided in a fifth comb tooth region on the n-side contact electrode, the protective layer covering the p-side contact electrode in a portion different from the p-side pad opening, covering the n-side contact electrode in a portion different from the n-side pad opening, and being made of a dielectric material;
   a p-side pad electrode provided on the protective layer and connected to the p-side contact electrode in the p-side pad opening, and
   an n-side pad electrode provided on the protective layer and connected to the n-side contact electrode in the n-side pad opening.

2. The semiconductor light-emitting device according to claim 1, wherein
   the n-side contact electrode includes: a plurality of n-side finger electrodes provided at intervals in a first direction and extending in a second direction intersecting the first direction; and an n-side bus bar electrode connecting ends of the plurality of n-side finger electrodes and extending in the first direction along an outer edge of the n-type semiconductor layer,
   each of the active layer and the p-type semiconductor layer includes an inner finger part inserted between the plurality of n-side finger electrodes and extending in the second direction, an outer finger part extending in the second direction along the outer edge of the n-type semiconductor layer, and a bus bar part connecting ends of the inner finger part and the outer finger part and extending in the first direction along the outer edge of the n-type semiconductor layer, and
   the p-side contact electrode includes a p-side inner finger electrode provided on the inner finger part, a p-side outer finger electrode provided on the outer finger part, and a p-side bus bar electrode provided on the bus bar part and connecting ends of the p-side inner finger electrode and the p-side outer finger electrode.

3. The semiconductor light-emitting device according to claim 2, wherein
a width of the outer finger part in the first direction is smaller than a width of the inner finger part in the first direction, and a width of the p-side outer finger electrode in the first direction is smaller than a width of the p-side inner finger electrode in the first direction.

4. The semiconductor light-emitting device according to claim 1, wherein
the n-side contact electrode includes an n-side contact layer in contact with the n-type semiconductor layer, a first current diffusion layer provided on the n-side contact layer, and a second current diffusion layer provided on the first current diffusion layer,
the p-side contact electrode includes a p-side contact layer in contact with the p-type semiconductor layer and a p-side current diffusion layer provided on the n-side contact layer,
a difference between a height of an upper surface of the p-side contact layer and a height of an upper surface of the first current diffusion layer is 100 nm or smaller, and
a difference between a height of an upper surface of the p-side current diffusion layer and a height of an upper surface of the second current diffusion layer is 100 nm or smaller.

5. The semiconductor light-emitting device according to claim 1, further comprising:
a p-side bump provided at a position on the p-side pad electrode that overlaps the third comb tooth region;
an n-side bump provided at a position on the n-side pad electrode that overlaps the third comb tooth region; and
a packaging substrate bonded to the p-side bump and the n-side bump.

6. A method of manufacturing a semiconductor light-emitting device, comprising:
forming an active layer made of an AlGaN-based semiconductor material on an n-type semiconductor layer made of an n-type AlGaN-based semiconductor material;
forming a p-type semiconductor layer on the active layer;
removing the p-type semiconductor layer and the active layer in a region different from a first comb tooth region on the n-type semiconductor layer to expose an upper surface of the n-type semiconductor layer;
forming an n-side contact electrode in a second comb tooth region on the n-type semiconductor layer inserted in the first comb tooth region;
forming a p-side contact electrode in a third comb tooth region on the p-type semiconductor layer;
forming a protective layer covering the p-side contact electrode and the n-side contact electrode and made of a dielectric material;
forming a p-side pad opening in a fourth comb tooth region on the p-side contact electrode, the p-side pad opening extending through the protective layer;
forming an n-side pad opening in a fifth comb tooth region on the n-side contact electrode, the n-side pad opening extending through the protective layer;
forming a p-side pad electrode provided on the protective layer and connected to the p-side contact electrode in the p-side pad opening; and
forming an n-side pad electrode provided on the protective layer and connected to the n-side contact electrode in the n-side pad opening.

7. The method of manufacturing a semiconductor light-emitting device according to claim 6, further comprising:
forming a p-side bump and an n-side bump on a packaging substrate; and
bonding the p-side bump at a position on the p-side pad electrode that overlaps the third comb tooth region and bonding the n-side bump at a position on the n-side pad electrode that overlaps the third comb tooth region.

\* \* \* \* \*